United States Patent
Cook

(10) Patent No.: US 11,215,650 B2
(45) Date of Patent: Jan. 4, 2022

(54) PHASE ALIGNED BRANCH ENERGY METER

(71) Applicant: Veris Industries, LLC, Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 264 days.

(21) Appl. No.: 15/789,496

(22) Filed: Oct. 20, 2017

(65) Prior Publication Data

US 2018/0246150 A1   Aug. 30, 2018

Related U.S. Application Data

(60) Provisional application No. 62/464,595, filed on Feb. 28, 2017.

(51) Int. Cl.
*G01R 21/133* (2006.01)
*G01R 15/16* (2006.01)
(Continued)

(52) U.S. Cl.
CPC .......... *G01R 21/133* (2013.01); *G01R 15/16* (2013.01); *G01R 19/2513* (2013.01); *G01R 21/06* (2013.01)

(58) Field of Classification Search
CPC .. G01R 21/133; G01R 15/16; G01R 19/2513; G01R 21/06
(Continued)

(56) References Cited

U.S. PATENT DOCUMENTS 1,100,171 A   6/1914   Brown
1,455,263 A   5/1923   Oberfell
(Continued)

FOREIGN PATENT DOCUMENTS

EP   1531334 A2   5/2005
EP   2241898 A1   10/2010
(Continued)

OTHER PUBLICATIONS

Schmid, Thomas et al., "Meter any wire, anywhere by virtualizing the voltage channel," Buildsys' 10: Proceedings of the 2nd ACM Workshop on Embedded Sensing Systems for Energy-Efficiency in Building; Zurich, Switzerland, Nov. 3-5, 2010, vol. 10, 6 pages.
(Continued)

*Primary Examiner* — Michael P Nghiem
*Assistant Examiner* — Dacthang P Ngo
(74) *Attorney, Agent, or Firm* — Chernoff, Vilhauer, McClung & Stenzel, LLP

(57) ABSTRACT

A phase aligned energy metering system includes a plurality of current sensors that provide a respective first signal indicating respective the current levels. A current module connected to the plurality of current sensors and processing the first signal with a stored current sensor error correction data to output a first corrected signal. A non- contact voltage providing a respective second signal indicating respective the voltage levels. The non-contact voltage sensor provides a second respective signal. A contact voltage sensor provides a respective third signal indicating respective the voltage levels. A voltage module receives the third respective signal indicating the respective voltage levels and processing the third signal with a stored voltage sensor error correction data to output a third corrected signal. An energy meter receives the first respective signal, the second respective signal, and the third respective signal, and determines a power level.

20 Claims, 22 Drawing Sheets

(51) Int. Cl.
  *G01R 19/25* (2006.01)
  *G01R 21/06* (2006.01)
(58) Field of Classification Search
  USPC .......................................................... 702/60
  See application file for complete search history.

(56) References Cited

U.S. PATENT DOCUMENTS

| | | |
|---|---|---|
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Tipton et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah |
| 5,365,462 A | 11/1994 | McBean |
| D354,945 S | 1/1995 | Dellavecchia et al. |
| 5,384,712 A | 1/1995 | Oravetz et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Saft |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr |
| 5,753,983 A | 5/1998 | Dickie et al. |
| 5,784,249 A | 7/1998 | Pouliot |
| 5,808,846 A | 9/1998 | Holce et al. |

(56) References Cited

U.S. PATENT DOCUMENTS

| | | |
|---|---|---|
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | Carter |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,312,964 B2 | 12/2007 | Tchernobrivets |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,453,267 B2 | 11/2008 | Westbrock, Jr. et al. |
| 7,474,088 B2 | 1/2009 | Bowman et al. |
| 7,652,871 B2 | 1/2010 | Caggiano et al. |
| 8,085,055 B2 | 12/2011 | Rupert |
| 8,193,803 B2 | 6/2012 | Bose et al. |
| 8,212,548 B2 | 7/2012 | Parker et al. |
| 8,212,549 B2 | 7/2012 | McNulty et al. |
| 8,294,453 B2 | 10/2012 | Bowman |
| 8,405,383 B2 | 3/2013 | Agrawal et al. |
| 8,421,443 B2 | 4/2013 | Bitsch et al. |
| 8,610,438 B1 | 12/2013 | Sykora et al. |
| 8,612,792 B2 | 12/2013 | Fu et al. |
| 8,837,118 B2 | 9/2014 | McGrail |
| 8,878,475 B2 | 11/2014 | Bonvin et al. |
| 8,964,360 B2 | 2/2015 | Trout |
| 8,988,062 B2 | 3/2015 | Sykora et al. |
| 9,146,264 B2 | 9/2015 | Cook |
| 9,329,659 B2 | 5/2016 | Cook |
| 9,395,344 B2 | 7/2016 | Sheley |
| 9,424,975 B2 | 8/2016 | Cook et al. |
| 9,577,443 B2 | 2/2017 | Gach et al. |
| 9,588,148 B2 | 3/2017 | Cook et al. |
| 9,607,749 B2 | 3/2017 | Cook et al. |
| 2001/0040446 A1 | 11/2001 | Lapinksi |
| 2004/0227503 A1 | 11/2004 | Bowman |
| 2005/0240362 A1 | 10/2005 | Randall |
| 2006/0085144 A1 | 4/2006 | Slota et al. |
| 2006/0103548 A1 | 5/2006 | Borkowski et al. |
| 2006/0164096 A1 | 7/2006 | Kwon |
| 2006/0181242 A1 | 8/2006 | Freed |
| 2006/0238932 A1 | 10/2006 | Westbrock |
| 2007/0153438 A1 | 7/2007 | Caggiano et al. |
| 2008/0303511 A1 | 12/2008 | Grno |
| 2009/0115400 A1 | 5/2009 | Hunter |
| 2009/0115620 A1 | 5/2009 | Hunter |
| 2009/0295370 A1 | 6/2009 | Parker |
| 2010/0117626 A1 | 5/2010 | Wertz et al. |
| 2010/0176960 A1 | 7/2010 | Bitsch |
| 2010/0207604 A1* | 8/2010 | Bitsch .................. G01R 21/133 324/140 R |
| 2010/0235122 A1 | 9/2010 | McCrea |
| 2010/0308792 A1 | 12/2010 | Rupert |
| 2011/0098985 A1 | 4/2011 | Lawson |
| 2011/0181124 A1 | 7/2011 | Uesaka |
| 2012/0112681 A1 | 5/2012 | Bonvin |
| 2012/0203481 A1* | 8/2012 | Carpenter ............ G01R 21/133 702/62 |
| 2012/0221278 A1* | 8/2012 | Cook .................. G01R 21/133 702/107 |
| 2012/0235667 A1 | 9/2012 | Agrawal et al. |
| 2012/0319675 A1* | 12/2012 | El-Essawy ............. G01R 35/02 324/74 |
| 2013/0024714 A1 | 1/2013 | Fu et al. |
| 2013/0027818 A1 | 1/2013 | McGrail |
| 2013/0144545 A1 | 6/2013 | Fu et al. |
| 2013/0211751 A1 | 8/2013 | Park et al. |
| 2013/0294014 A1 | 11/2013 | Irons |
| 2014/0239964 A1 | 8/2014 | Gach et al. |
| 2015/0028848 A1 | 1/2015 | Lynch et al. |
| 2015/0293549 A1 | 10/2015 | Lal et al. |
| 2016/0154025 A1* | 6/2016 | Song .................... G01R 15/16 324/126 |
| 2017/0336444 A1* | 11/2017 | Sela .................. G01R 19/16528 |
| 2018/0306839 A1* | 10/2018 | Donnal ................ G01R 21/133 |

FOREIGN PATENT DOCUMENTS

| | | |
|---|---|---|
| WO | 99/42844 A1 | 8/1999 |
| WO | 2016176315 A1 | 11/2016 |

(56) References Cited

OTHER PUBLICATIONS

European Search Report prepared by the European Patent Office for EP 18158636, dated Jul. 13, 2018, 8 pages.

\* cited by examiner

PHASE ALIGNED BRANCH ENERGY METER

CROSS-REFERENCE TO RELATED APPLICATIONS

This application claims the benefit of U.S. Provisional Patent App. No. 62/464,595, filed Feb. 28, 2017.

BACKGROUND OF THE INVENTION

The present invention relates to a phase aligned energy metering system.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While such power metering devices tend to measure energy properties when the current and voltage measurements are phase aligned, the alignment of the voltage and current phases tends to be prone to configuration error.

DETAILED DESCRIPTION OF PREFERRED EMBODIMENTS

Figure 1:
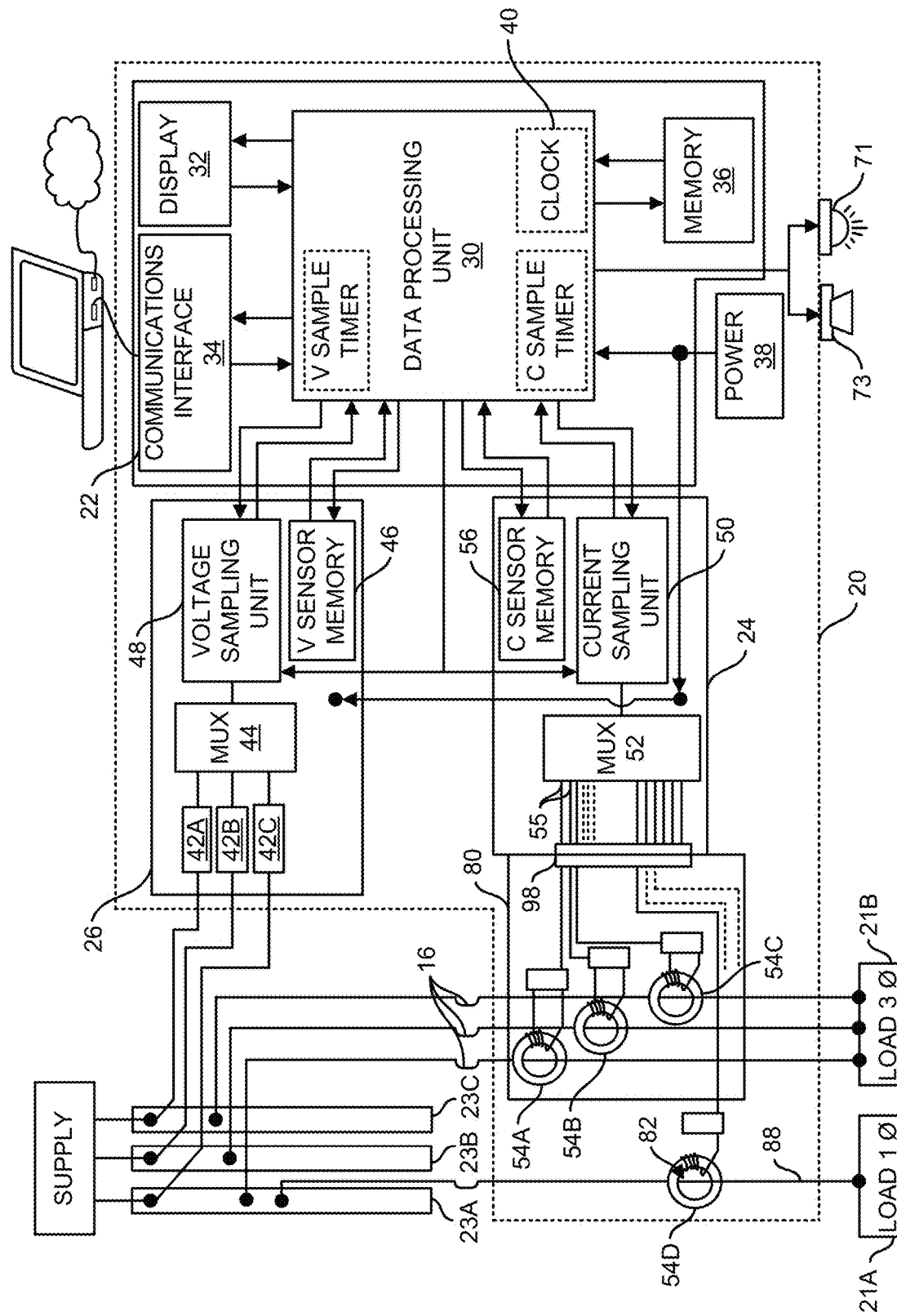
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 2:
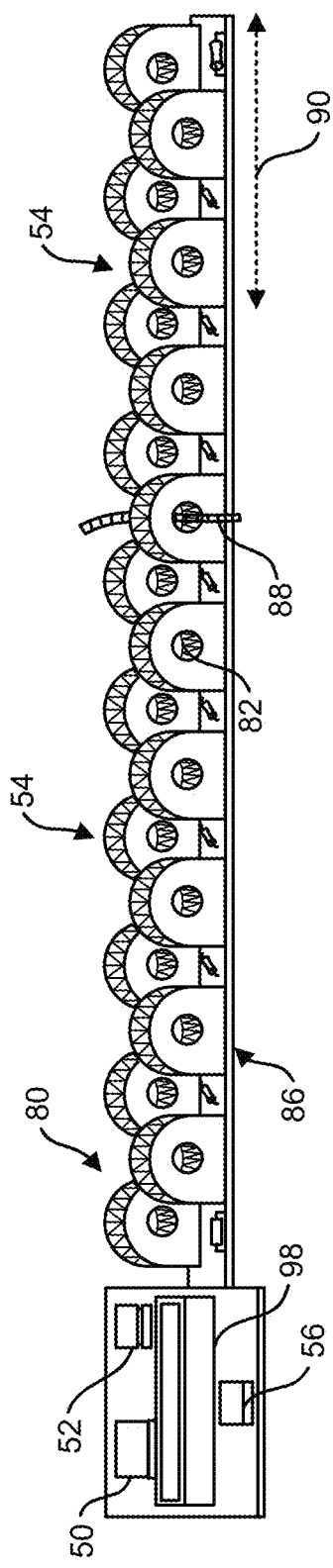
FIG. 2 is a perspective view of a current transformer strip for a branch current monitor.
Figure 3:
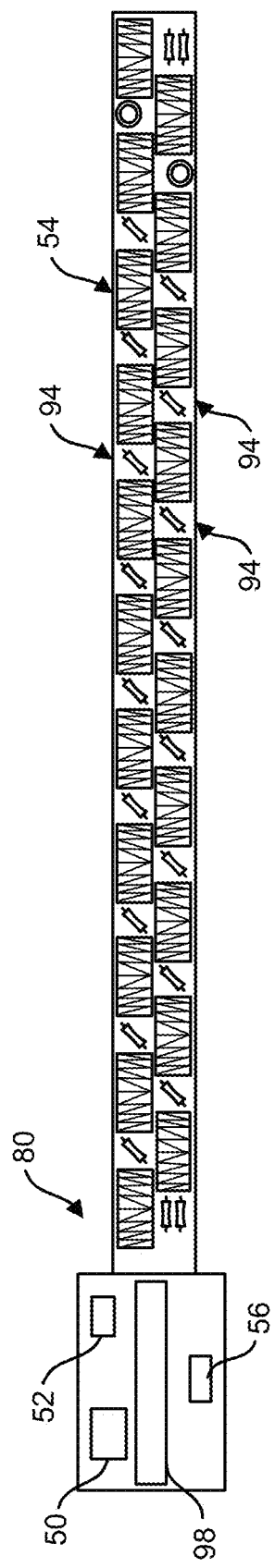
FIG. 3 is a top view of the current transformer strip of FIG. 2.
Figure 4:
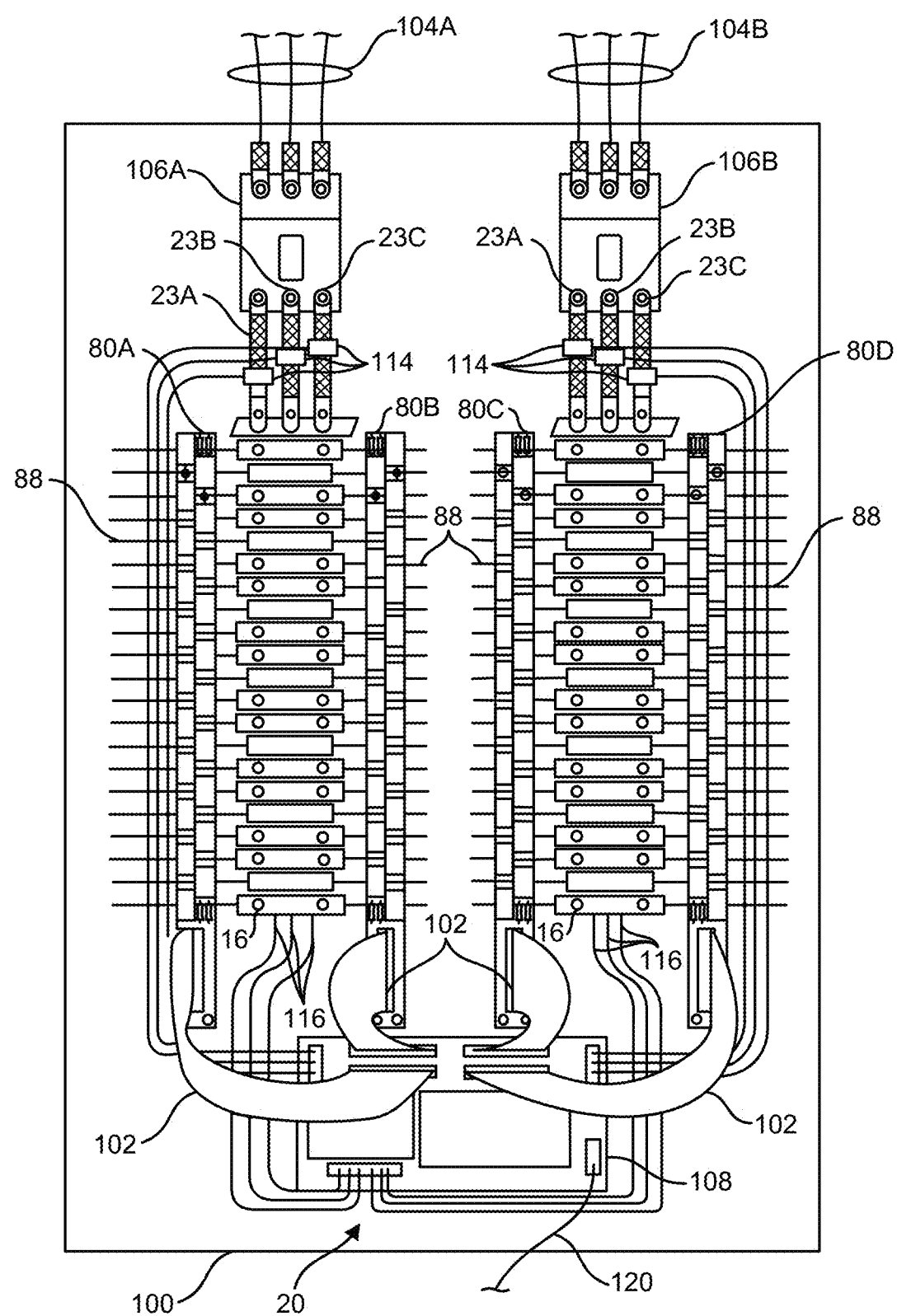
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition. the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
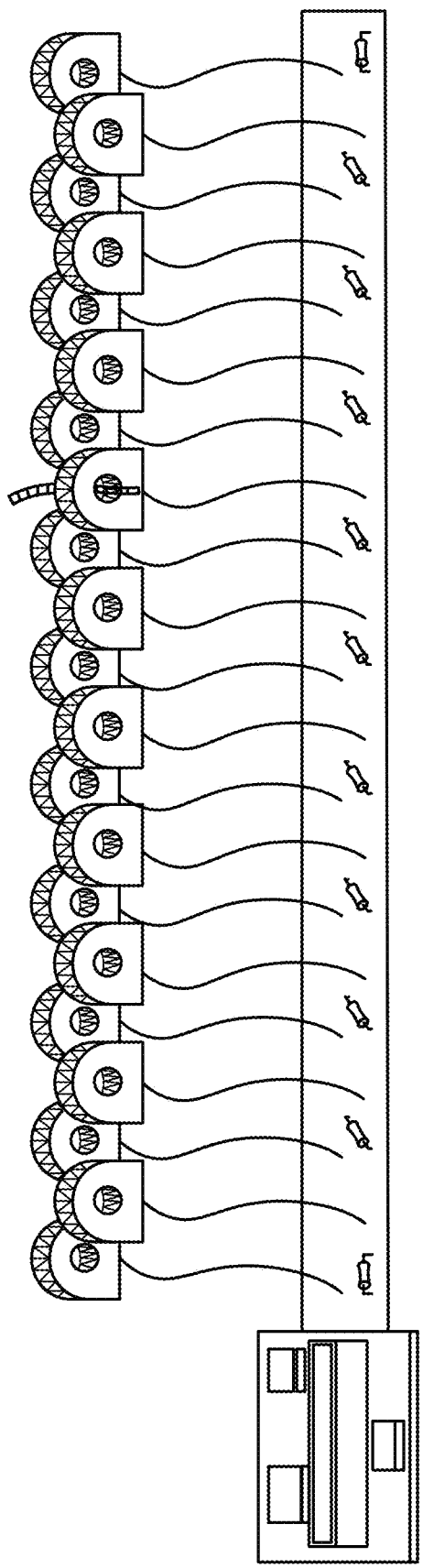
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
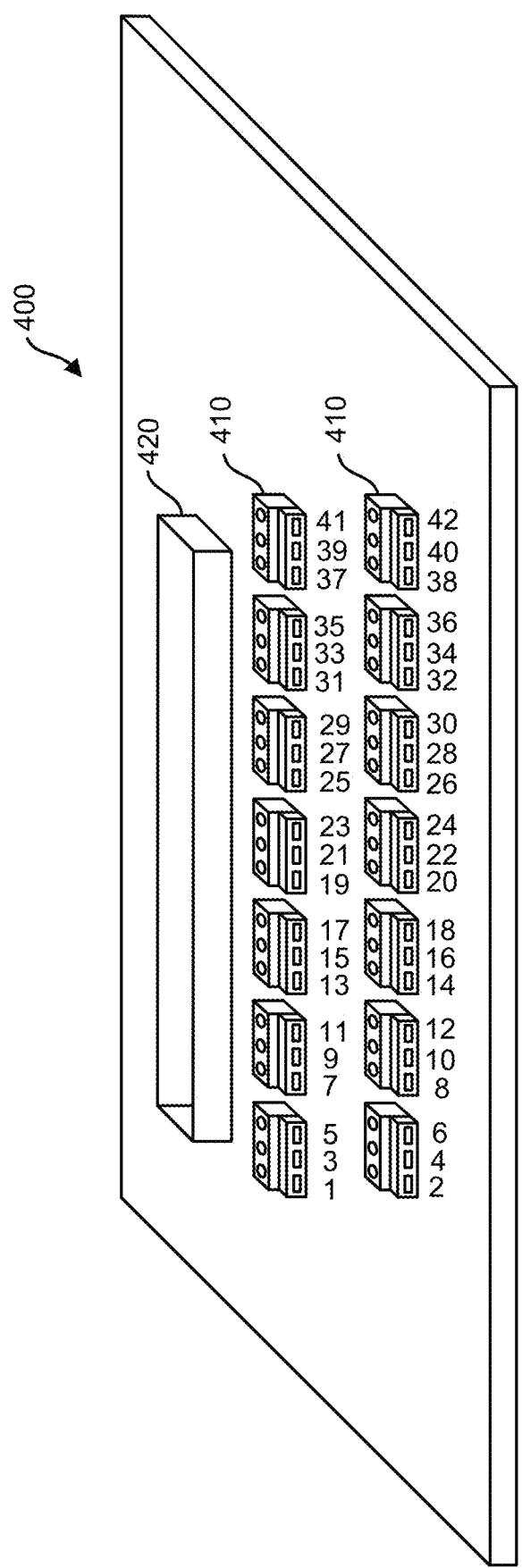
FIG. 6 illustrates a view of a connector board for a branch current monitor.

Referring to FIG. 6, another embodiment includes a set of one or more connector boards 400 in addition to or as an alternative to the strip units. Each of the connector boards may include a set of connectors 410 that may be used to interconnect a current transformer thereto. Each of the connector boards may include a connector 420 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

Figure 7:
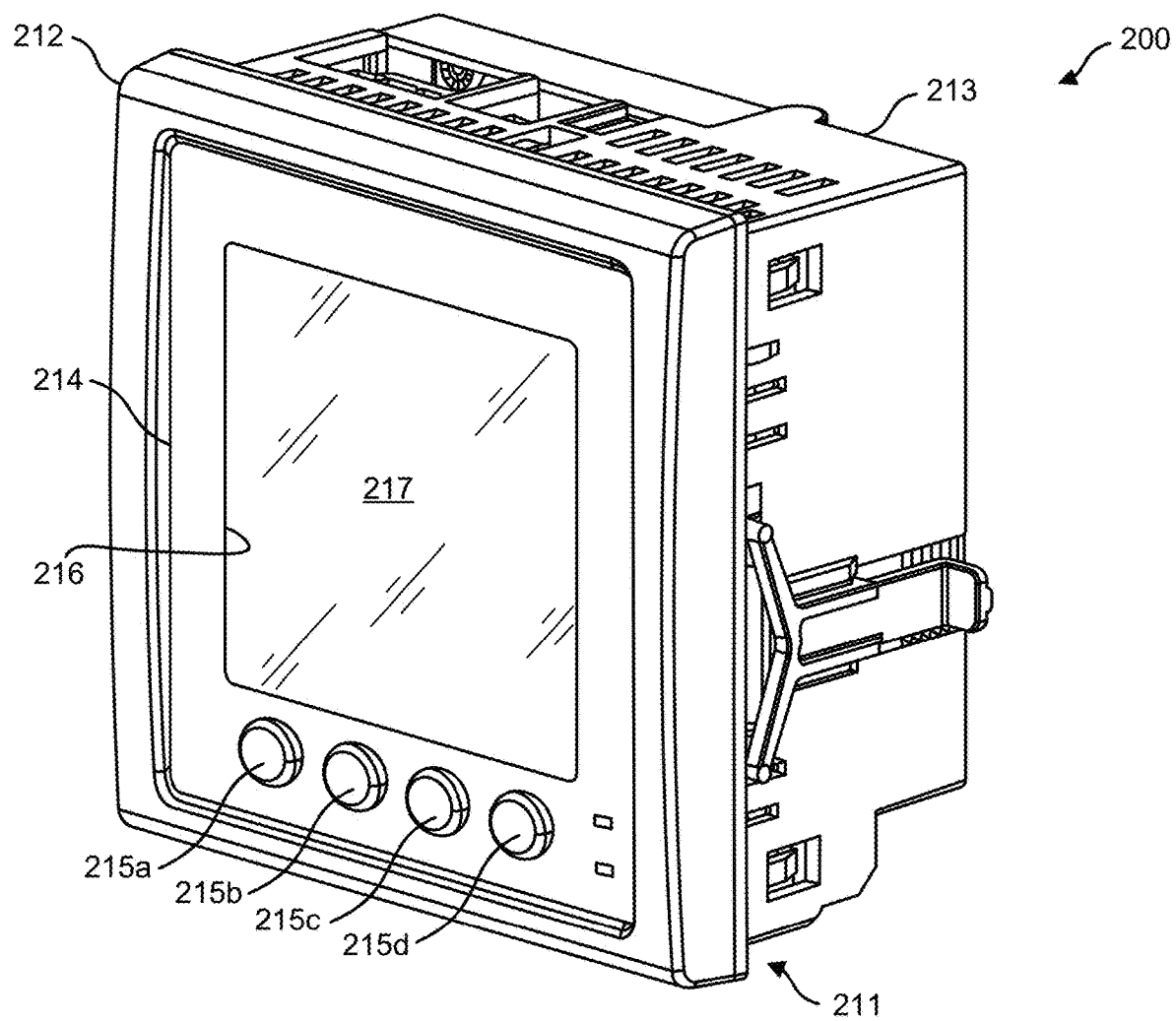
FIG. 7 illustrates an exemplary embodiment of a power meter.

Referring to FIG. 7, another embodiment of a power meter 200 is housed in a housing 211 formed by a front bezel 212 and a back cover 213 that snap together. The front bezel 212 may be bonded to a user-interface panel 214 that contains four manually operable pushbuttons 215a-215d and a central window 216 for viewing a display 217, such as an LCD, attached to the bezel 212. Behind the display 217 is a printed circuit board 218 (see FIG. 8) that has multiple terminal blocks 219a-219e and associated circuitry 220 mounted on one or both sides of the board 218. The terminal blocks 219a and 219b are used to connect the circuitry 220 to a control power supply and voltage input lines, respectively. For example, the voltage lines may be from the power panel or from the wire to the load(s). In addition the same voltage lines, for example from the power panel or the wire to the load, may further be extended to pass through a respective current transformer to sense the current therein. Also, a respective current sensor of a set of one or more current transformers may encircle a respective wire to a load, where the wires from the respective current transformer being interconnected to suitable terminals of one or more of the terminal blocks. In this manner, the power meter is capable of sensing or otherwise receiving signals representative of the voltage and current in the wires to the load(s). Terminal block 219c may be used to connect digital outputs of the circuitry 220, such as demand sync signals, alarm signals or external control signals, to relays, motors, meters or other devices. Terminal block 129d may be an RS485 port used for communicating with a monitoring and control system and can be daisy chained to multiple devices. Terminal block 219e may be used to receive digital inputs for determining circuit breaker status, counting pulses, counting motor starts, accepting demand sync pulses, and/or input metering. The terminal blocks 219a-219e and the circuitry 220 (simplified for purposes of illustration) may be used to monitor either a single-phase, a two-phase, and/or a three-phase electrical power distribution system. Typically the meter is used to measure currents and voltages and report in real time their root-mean-square values, which includes values for all three phases and neutral in the case of a three-phase power distribution system. The meter also typically calculates power factor, real power, reactive power and other electrical parameters. In some embodiments, the housing 211 includes one or more connectors suitable to detachably connect a separate power meter to sense electrical properties of the current and/or voltage being sensed.

Figure 9:
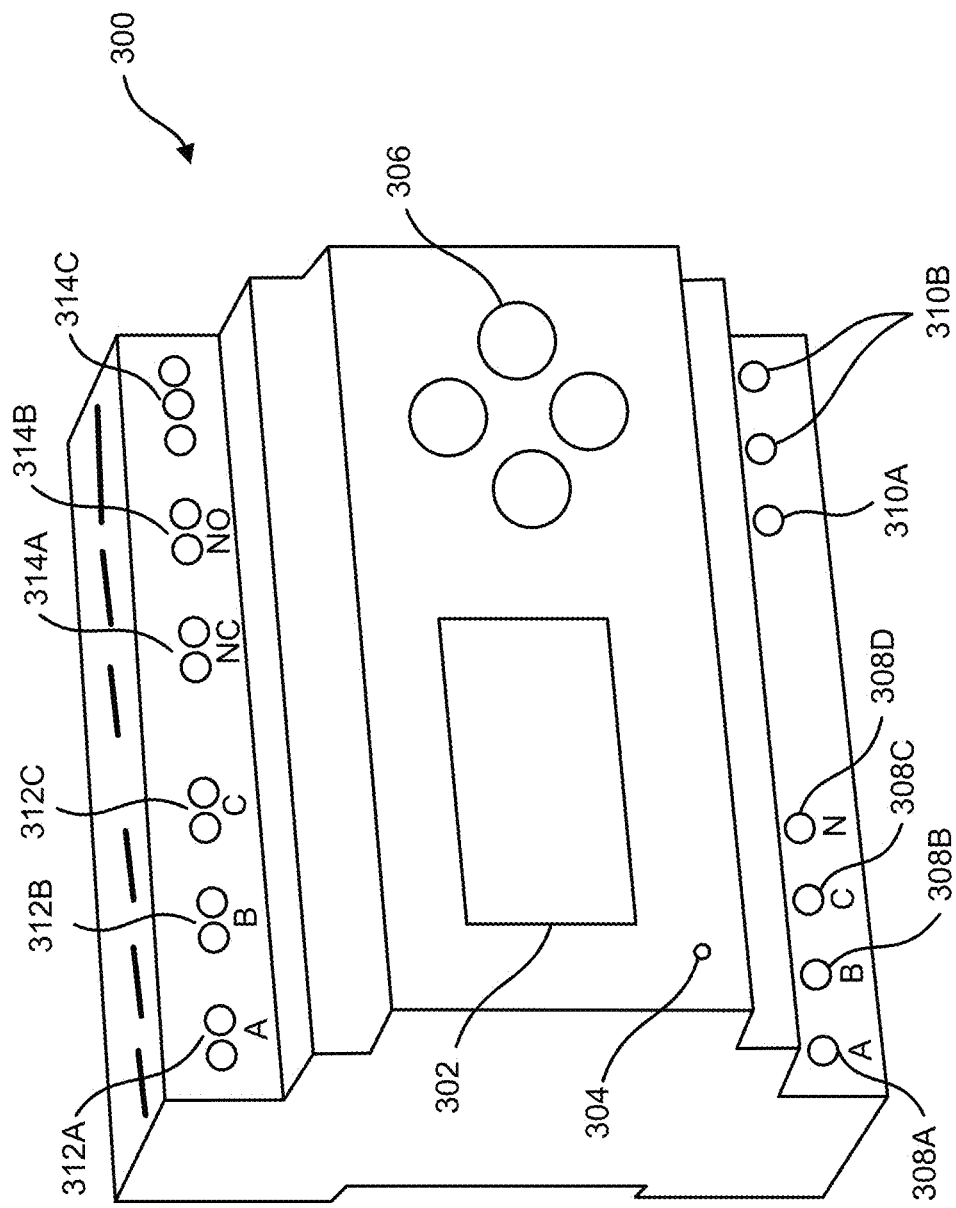
FIG. 9 illustrates another exemplary embodiment of a power meter.

Referring to FIG. 9, another embodiment of a power meter 300 housed within a housing suitable to be mounted to a standard 35 mm DIN rail or screw-mounted to the interior surface of an enclosure. The power meter 300 may include an alphanumeric display 302 to display information, such as power usage and the type thereof. The power meter 300 may include an alarm light 304 when an alarm condition occurs. The power meter 300 may include a set of configuration buttons 306. The power meter may include a set of voltage inputs, such as voltage A 308A, voltage B 308B, voltage C 308C, and voltage neutral 308D. The power meter 300 may also include an earth ground 310A and control power 310B. The power meter 300 may sense the current by using current transformers that are respectively interconnected to current sensor input phase A 312A, current sensor input phase B 312B, and/or current sensor input phase C 312C. The power meter 300 may have a set of outputs, such as a normally closed phase loss alarm 314A, a normally open pulse output representative of energy usage 314B, and other outputs 314C. In some embodiments, the power meter 300 includes one or more connectors suitable to detachably connect a separate power meter to sense electrical properties of the current and/or voltage being sensed.

Figure 10:
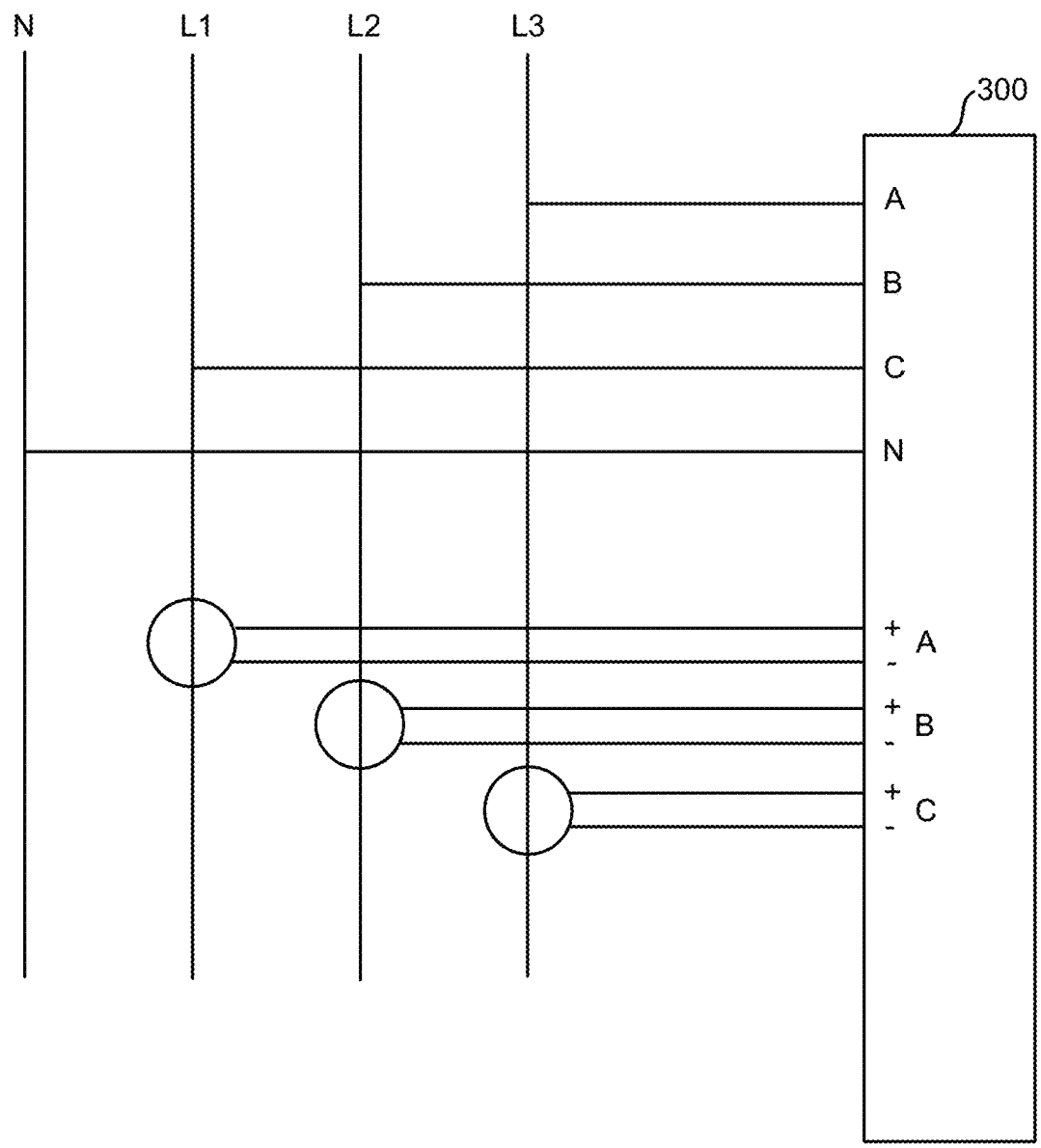
FIG. 10 illustrates one manner of wiring a power meter for sensing voltage and current.

Referring to FIG. 10, an exemplary wiring diagram for a 3-phase 3-wire current transformer with a neural is illustrated. By way of example, the power meter may determine one or more of the following electrical parameters for one or more phases of the input, such as real energy, total instantaneous real power, total instantaneous reactive power, total instantaneous apparent power, total power factor, voltage L-L, voltage average, voltage L-N, current, real power, power factor, voltage phases A-B/B-C/A-C/A-N/B-N/C-N, instantaneous current, frequency, apparent energy consumption, reactive energy consumption, apparent power, reactive power, total real power, total reactive power, total apparent power, etc.

In some embodiments, the power meter may be electrically connected in series with the loads, if desired. As illustrated in FIG. 1 through FIG. 10, the power meter may be in many different configurations and form factors. All or portions of the power meter is preferably housed in a housing. Whether housed in a housing or not housed in a housing, all or portions of the power meter preferably include one or more connectors suitable to detachably connect a separate power meter to sense electrical properties of the power meter, such as the voltage and/or current so that the additional power meter may determine power measurements.

Figure 11:
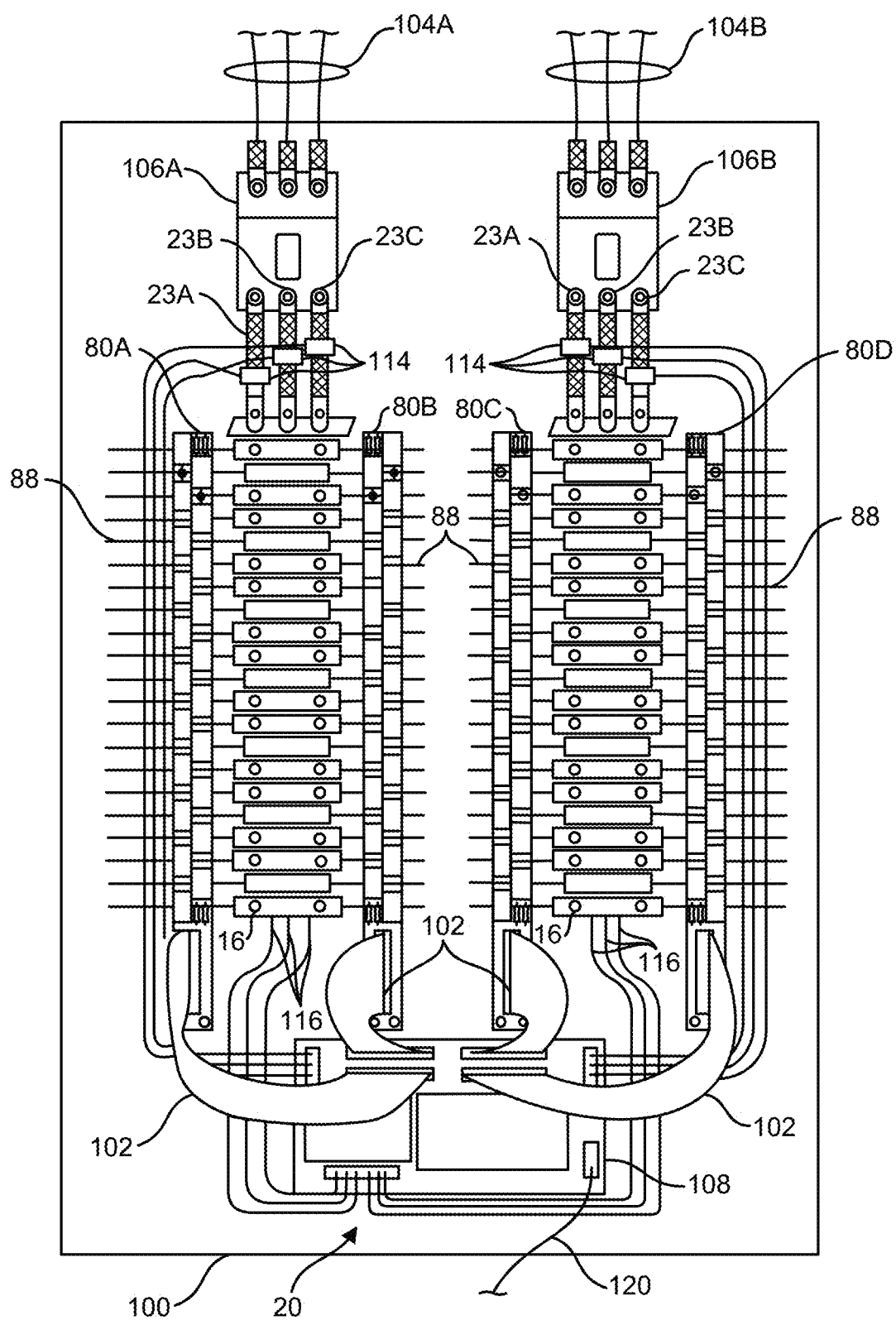
FIG. 11 illustrates a misaligned branch energy monitor.

Referring again to FIG. 4 though FIG. 9, the installer of the system may misconnect one or more of the bus bars 23A, 23B, and/or 23C to the main acquisition board and accordingly the voltages would in most likely be improperly aligned with the current being provided by the corresponding power conductor. Referring also to FIG. 11, for example, phases A (23A) and B (23B) may be reversed on the connection on one side of the panel (e.g., left side) while being properly connected on the other side of the panel (e.g., right side) to the main acquisition board. Typically, the main acquisition board which should associate a selected set of power conductors with phase A will actually be associating the selected set of power conductors to phase B, and the main acquisition board which should associate a selected set of power conductors with phase B will actually be associating the selected set of power conductors to phase A. This will result in improper power calculations by the main acquisition board and other electrical characteristics.

Figure 12:
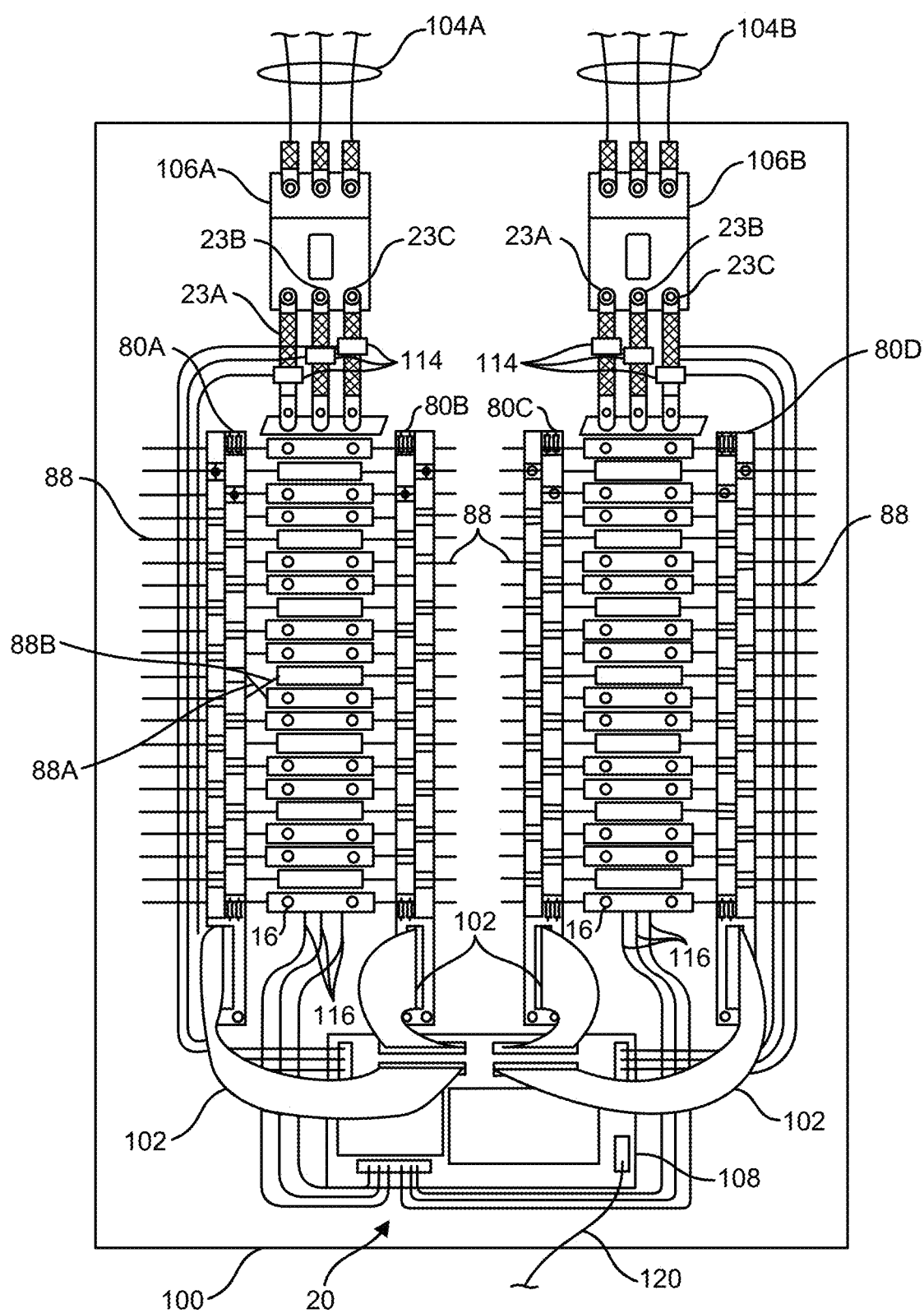
FIG. 12 illustrates another misaligned branch energy monitor.

Referring again to FIG. 4 though FIG. 9A, the installer of the system may misconnect one or more of the power conductors through the current transformer to the associated circuit breaker and thus improperly align one or more power conductors with the corresponding circuit breaker. Referring also to FIG. 12, for example, power conductor 88A and 88B may be reversed on the connection to the corresponding circuit breaker, which also change relationships the phase relationships of a multi-phase connection. Typically, the main acquisition board which should associate one or more power conductors with phase A will actually be associating the one or more power conductors with phase B, and the main acquisition board which should associate one or more of power conductors with phase B will actually be associating the one or more power conductors to phase A. This will result in improper power calculations by the main acquisition board and other electrical characteristics, in addition to improper association of the current measurements with the associated load in the case that the power conductors are interconnected to different loads.

Figure 13:
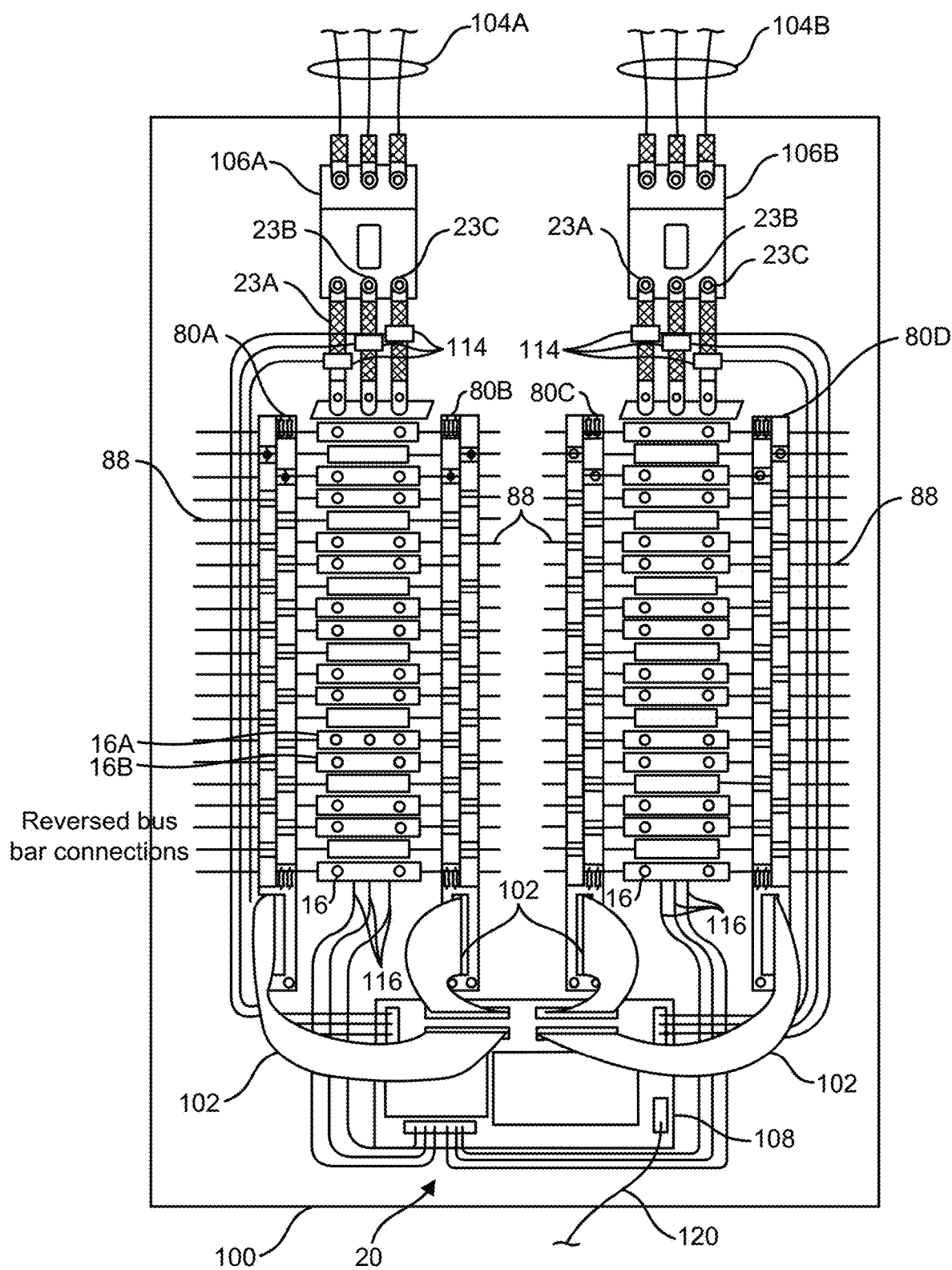
FIG. 13 illustrates another misaligned branch energy monitor.

Referring again to FIG. 4 though FIG. 9A, the installer of the power panel may misconnect one or more of the circuit breakers to a different bus bar than anticipated thus improperly align the power conductor with the corresponding bus bar. Referring also to FIG. 13, for example, circuit breaker 16A may be reversed from the anticipated connection to bus bar 23A to a connection to bus bar 23B, and circuit breaker 16B may be reversed from the anticipated connection to bus bar 23B to a connection to bus bar 23A, which changes the phases of a multi-phase connection. Typically, the main acquisition board which should associate one or more circuit breakers with phase A will actually be associating the one or more power conductors to phase B, and the main acquisition board which should associate one or more of circuit breakers with phase B will actually be associating the one or more power conductors to phase A. This will result in improper power calculations by the main acquisition board and other electrical characteristics, in addition to improper association of the current measurements with the associated load in the case that the power conductors are interconnected to different loads.

Figure 14:
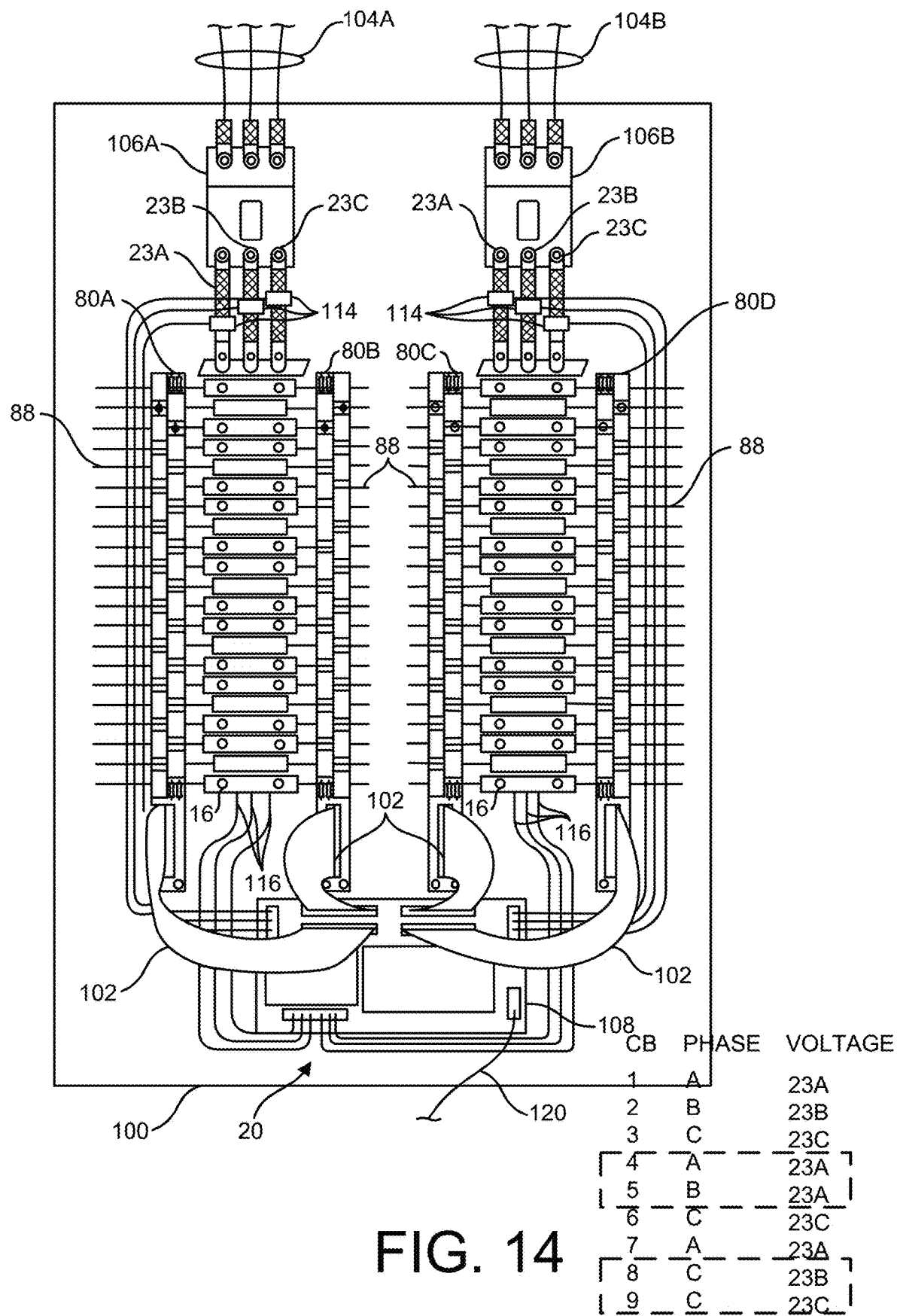
FIG. 14 illustrates another misaligned branch energy monitor.

Referring again to FIG. 4 though FIG. 9, the installer of the power panel may program configuration data into within the main acquisition board (or otherwise programmed into an interconnected network device) that aligns particular power conductors and their associated sensed current levels sensed by particular current transformers, with particular bus bars may include errors, thus improperly align the power conductors with the corresponding bus bars and/or sensed current levels. Referring also to FIG. 14, the configuration data may be incorrect and result in errors in the data calculations. For example, circuit breakers 9 and 9 are both improperly labeled as phase C and circuit breakers 4 and 5 are both improperly labeled voltage 23A and 23A.

As it may be observed, there are many sources of potential errors when configuring a branch current metering system which are problematic to identify and rectify. Furthermore, these problems persist in many different configurations, such as those embodiments illustrated in FIG. 4 through FIG. 9.

Figure 15A:
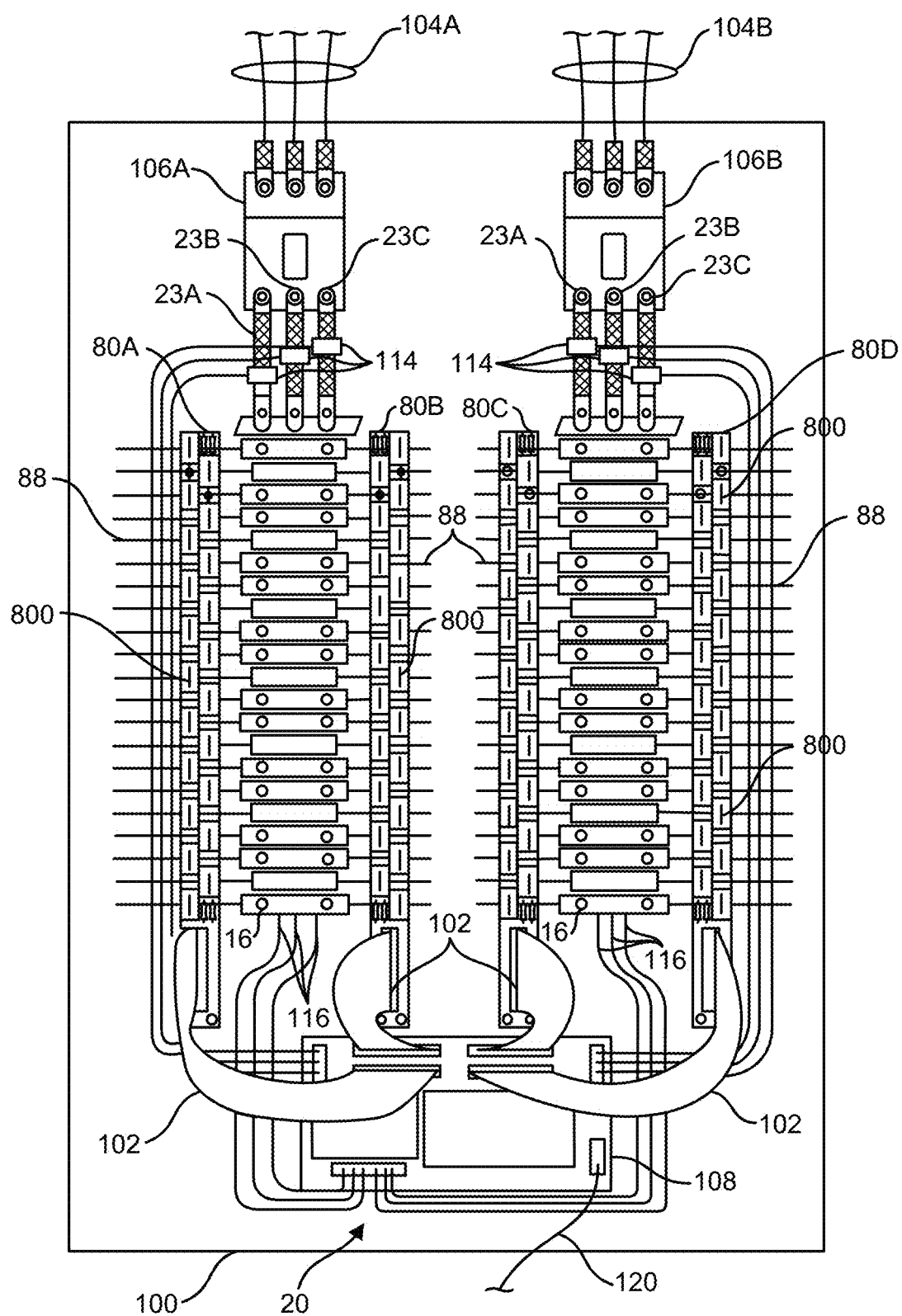
FIG. 15A illustrates a branch energy monitor with non-contact voltage sensors.

Referring to FIG. 15A, a modified branch energy meter preferably includes a non-contact voltage sensor 800 included together with one or more of the current transformers. Preferably, each of the current transformers includes an associated non-contact voltage sensor 800 to sense the voltage within the respective power conductor of the current transformer. The non-contact voltage sensor may use any suitable technology, such as for example, a capacitive coupling technique. The non-contact voltage sensor may be affixed to the exterior of the housing of the current transformer, may be enclosed within the exterior of the housing of the current transformer, or may be located at another suitable location to sense the voltage within the power conductor. The output of each of the non-contact voltage sensors is preferably provided to the main acquisition board with conductors on the supporting board of the current transformers and the flexible interconnect. Further, the output of each of the current transformers is preferably provided to the main acquisition board. The output from the non-contact voltage sensors provide a signal indicating the magnitude of the voltage levels (e.g., 110 or 220 volts) and the nature of the voltage waveform (60 hertz or 120 hertz) together with its waveform (which includes some level based information). The main acquisition board may provide the output of the current transformers to a network based computing device, if desired. The main acquisition board may provide the output of the non-contact voltage transformers to a network based computing device, if desired. The network based computing device may, if desired, determine the power usage for single phase, two phase, and/or three phase devices based upon the respective current(s) and voltage(s). Also, the main acquisition board may, if desired, determine the power usage for single phase, two phase, and/or three phase devices based upon the output of the current transformers and the corresponding non-contact voltage sensors. As it may be observed, by using the non-contact voltage sensors together with the current transformers, both sensing the electrical properties of the same respective power conductor, the corresponding voltage and current measurements are automatically aligned and therefore configuration errors are significantly reduced.

Figure 15B:
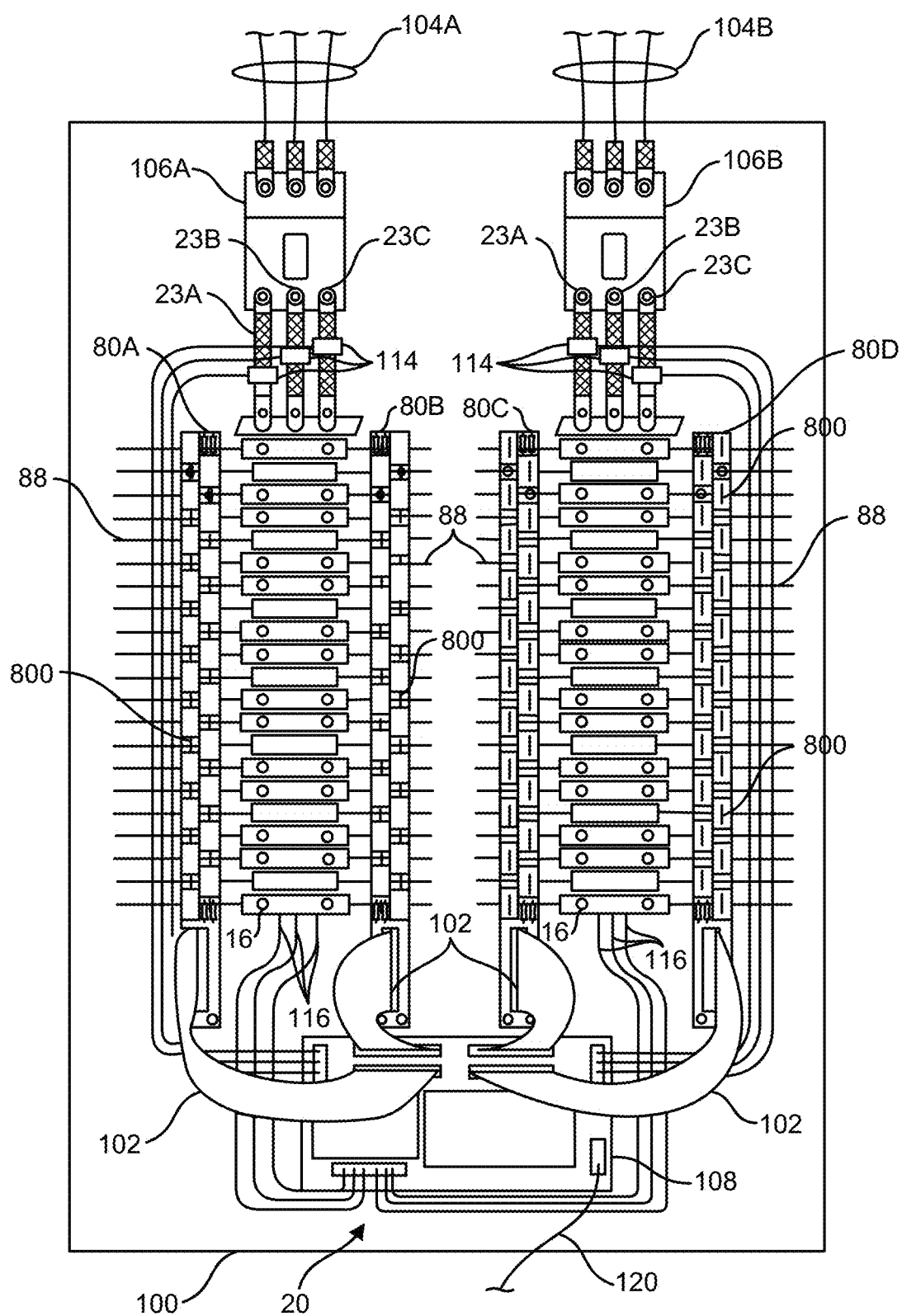
FIG. 15B illustrates another branch energy monitor with non-contact voltage sensors.

Referring to FIG. 15B, in some embodiments, one or more non-contact voltage sensors may be located in a position proximate one or more of the current transformers, although not necessarily supported by the current transformer and/or a housing enclosing a portion of the current transformer and/or a housing supporting the current transformer. Preferably, each of the non-contact voltage sensors may be located in a position proximate a corresponding current transformer. By way of example, the non-contact voltage sensors may be supported by the circuit board and electrically connected to the circuits supported by the circuit boards. Preferably, each of the non-contact voltage sensors are arranged to primarily sense the voltage within a corresponding power conductor.

In some embodiments, there may be more than one non-contact voltage sensor associated with a single power conductor. A plurality of non-contact voltage sensors may be used to determine the corresponding voltage in a power conductor in a manner that reduces the cross talk from other proximate power conductors by using the output of a plurality of non-contact voltage sensors. Also, one or more of the non-contact voltage sensors may be associated with a plurality of different power conductors, if desired.

In some embodiments, there may be non-contact voltage sensors that are supported by one or more of the current transformers and non-contact voltage sensors that are not supported by the current transformers.

Figure 16:
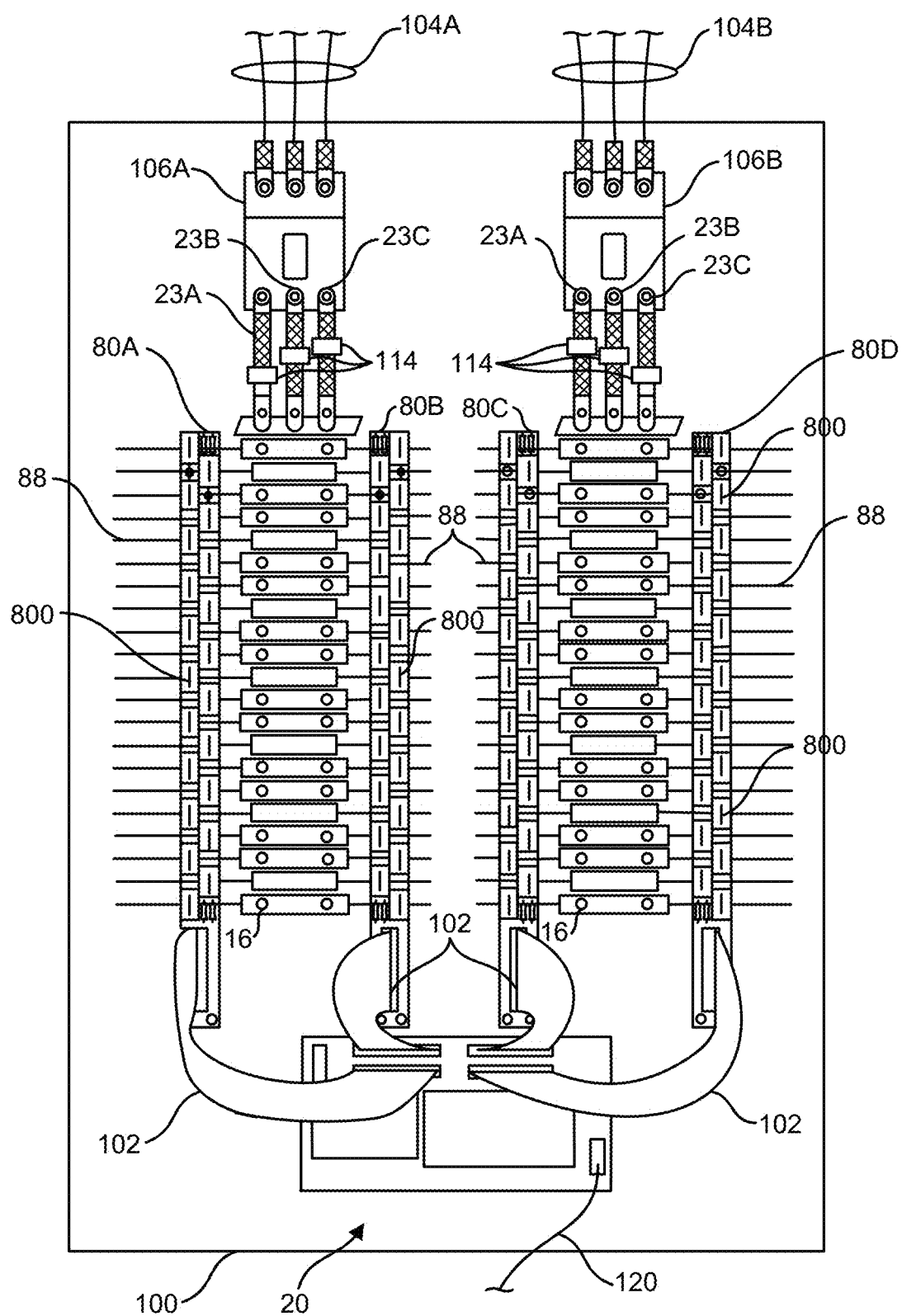
FIG. 16 illustrates a branch energy monitor with contact and non-contact voltage sensors.

Referring to FIG. 16, a modified branch energy meter preferably includes a non-contact voltage sensors 800 included together with respective ones of the current transformers. Preferably, each of the current transformers includes an associated non-contact voltage sensor to sense the voltage within the respective power conductor of the current transformer. The non-contact voltage sensor may use any suitable technology, such as for example, a capacitive coupling technique. The output of each of the non-contact voltage sensors is preferably provided to the main acquisition board. Also, the branch energy meter includes a voltage connection from the main acquisition board to each of the corresponding bus bars, such as bus bars 23A, 23B, and/or 23C. Further, the output of each of the current transformers is preferably provided to the main acquisition board.

Figure 17:
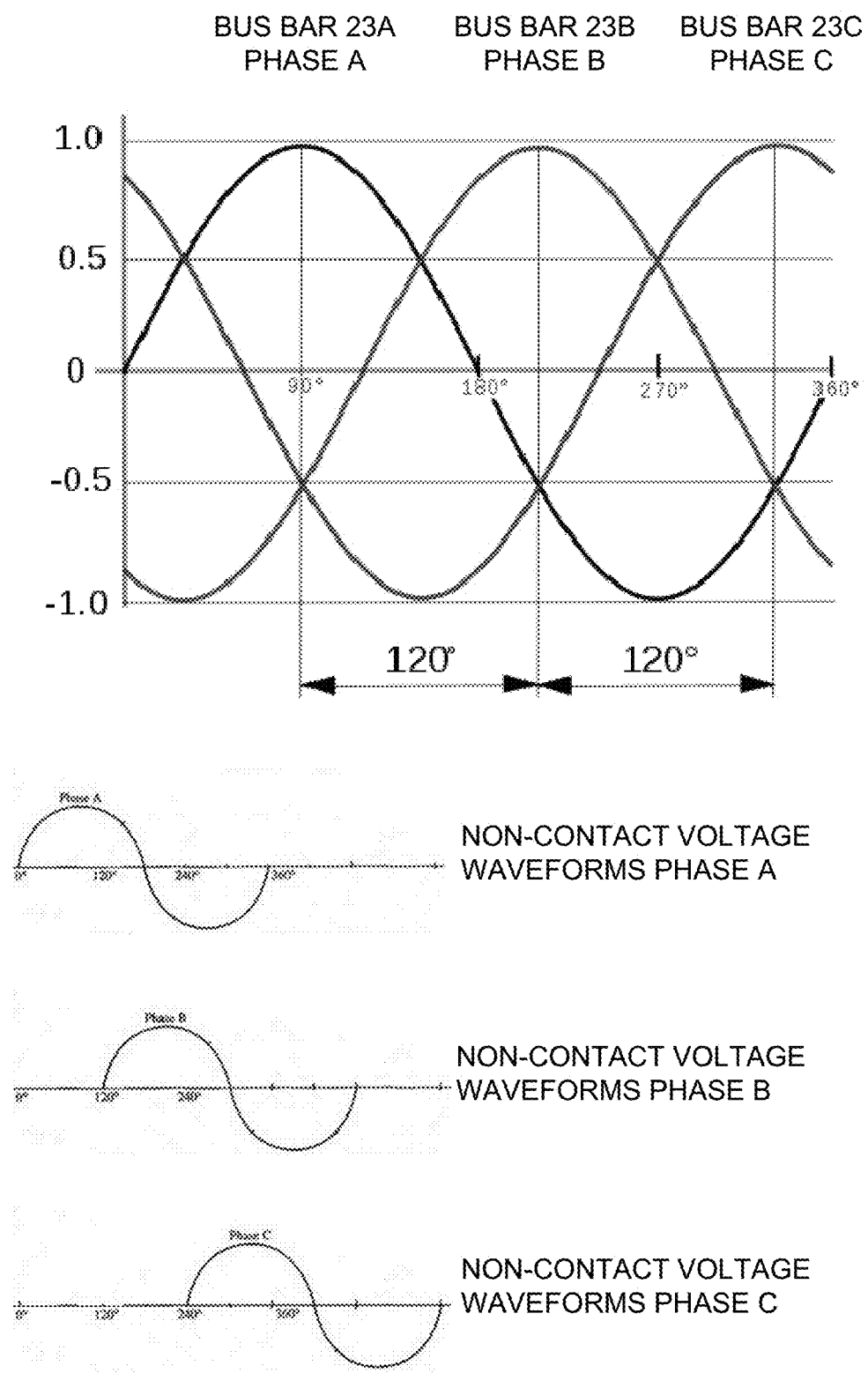
FIG. 17 illustrates phase alignment of contact and non-contact voltage sensors.

Referring to FIG. 17, while the non-contact voltage sensors may be relatively accurate, they may also be selected to be relatively inaccurate which tends to be less expensive while still providing a general indication of the magnitude of the voltage signal and/or the general nature of the voltage waveform. In this manner, the non-contact voltage sensors provides a generalized indication of the respective voltage waveform within the power conductor. The main acquisition board may receive accurate voltage connections from the bus bars 23A, 23B, and/or 23C. Each of the relatively inaccurate non-contact voltage measurements may be compared against one or more of the bus bars 23A, 23B, and/or 23C to determine the correct alignment of each power conductor with one of the voltage phases.

The main acquisition board may provide the output of the current transformers to a network based computing device, if desired. The main acquisition board may provide the output of the non-contact voltage transformers to a network based computing device, if desired. The network based computing device may, if desired, determine the power usage for single phase, two phase, and/or three phase devices. Also, the main acquisition board may, if desired, determine the power usage for single phase, two phase, and/or three phase devices based upon the output of the current transformers and the corresponding non-contact voltage sensors and/or the bus bar voltage connections. As it may be observed, by using the non-contact voltage sensors together with the current transformers, both sensing the electrical properties of the same respective power conductor, the corresponding voltage and current measurements are aligned and therefore configuration errors are significantly reduced. In the event that configuration errors are identified, the system may flag those configuration errors for the installer to correct. Alternatively, in the event that configuration errors are identified, the system may reassign particular voltage measurements from the bus bars to the appropriate current transformer(s). In this manner, the configuration errors may be reduced.

Figure 18:
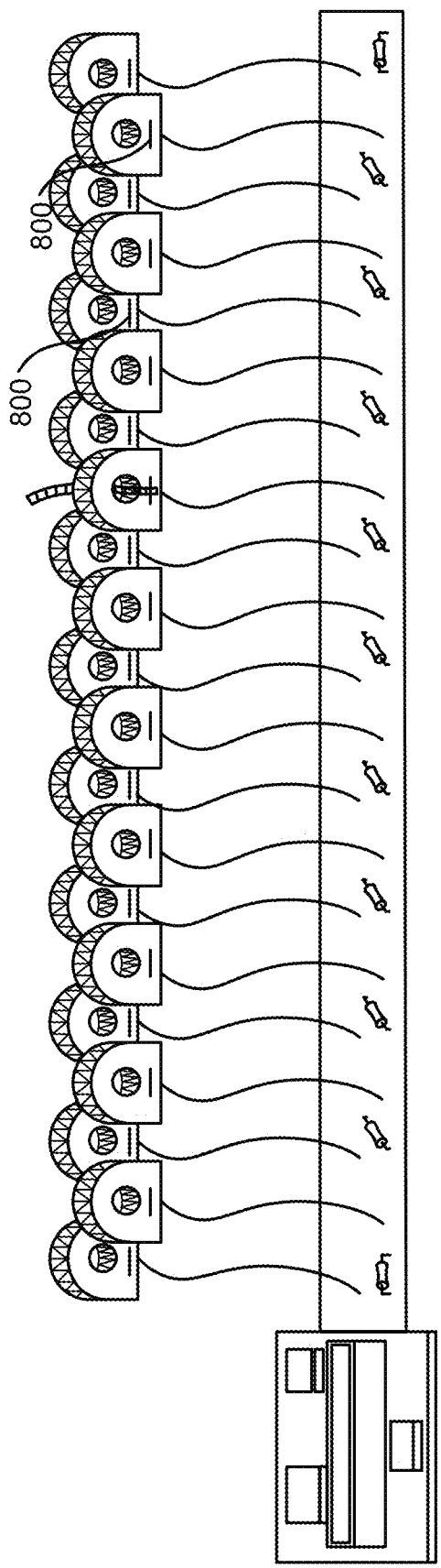
FIG. 18 illustrates another embodiment of a portion of a branch energy monitor.

Referring to FIG. 18, in another embodiment the current transformers together with the non-contact voltage sensor are interconnected to a supporting circuit board using a flexible interconnection. Preferably the flexible interconnection is detachably interconnected to the board, such as using a detachable connector, so that selected ones of the current transformers may be selectively replaced. The signals from the current transformer and the non-contact voltage sensors are provided, by way of the circuit board, to the main acquisition board or other computing device. Preferably the spacing of the current transformers is substantially consistent with the spacing of the circuit breakers of the panel.

Figure 19:
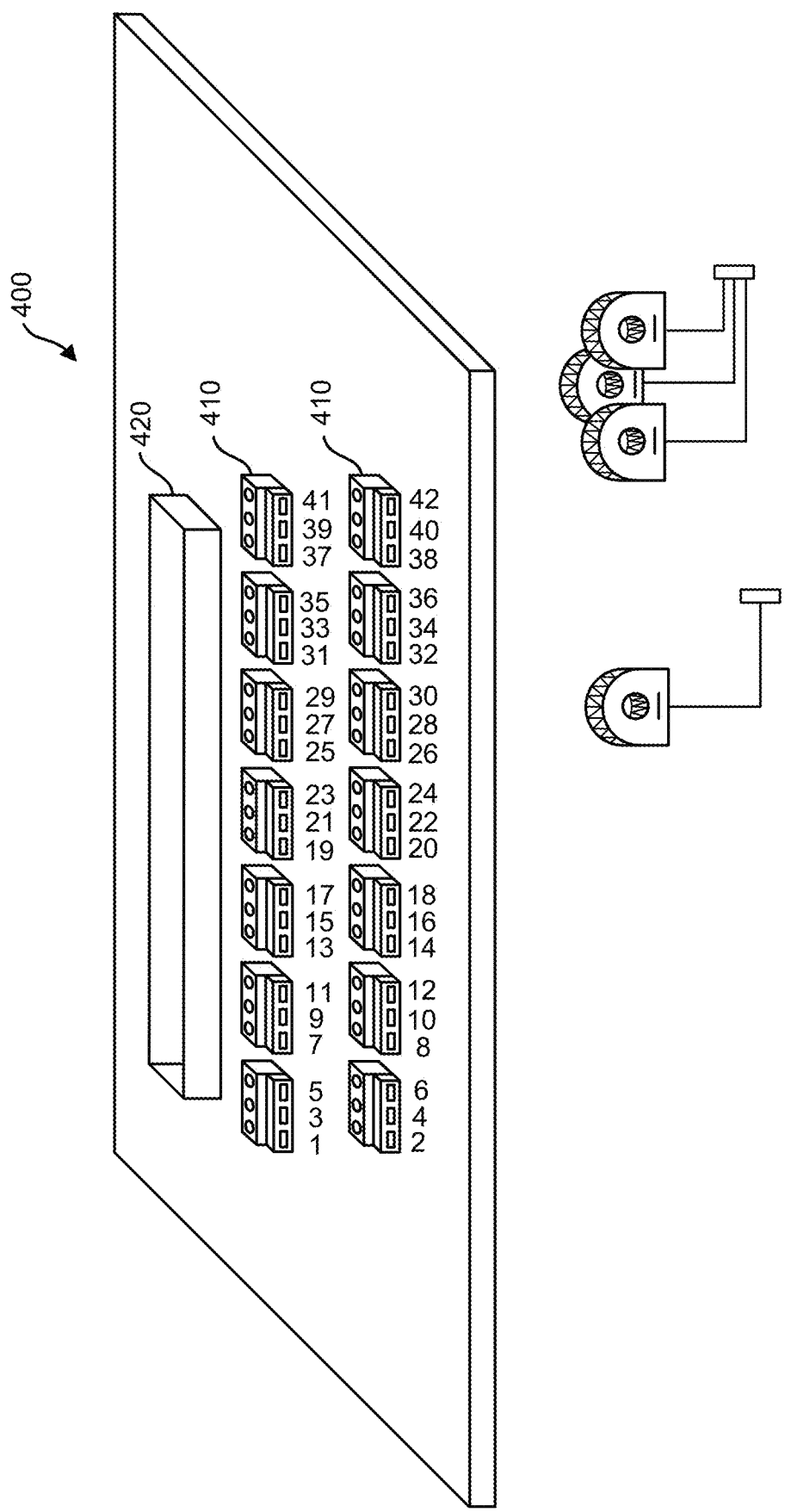
FIG. 19 illustrates another embodiment of a portion of branch energy monitor.

Referring to FIG. 19, in another embodiment a set of one or more conductor boards 400 may be used to or as an alternative to the strip units. Each of the connector boards may include a set of connectors 410 that may be used to interconnect a current transformer thereto. In one embodiment, each of the current transformers preferably includes a non-contact voltage sensor 800 and is electorally interconnected with one or more flexible wires to the connector board with a connector attached thereto. In another embodiment, the current transformers are grouped in sets of three for a three phase circuit and preferably include a set of three non-contact voltage sensors 800 and is electorally interconnected with one or more flexible wires to the connector board with a connector attached thereto. The connector board may, if desired, determine the power usage for each power conductor based upon data from the current transformer and non-contact voltage sensor or a direct connected voltage sensor to the bus bar, if desired. Each of the connector boards may include a connector 420 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

Figure 8:
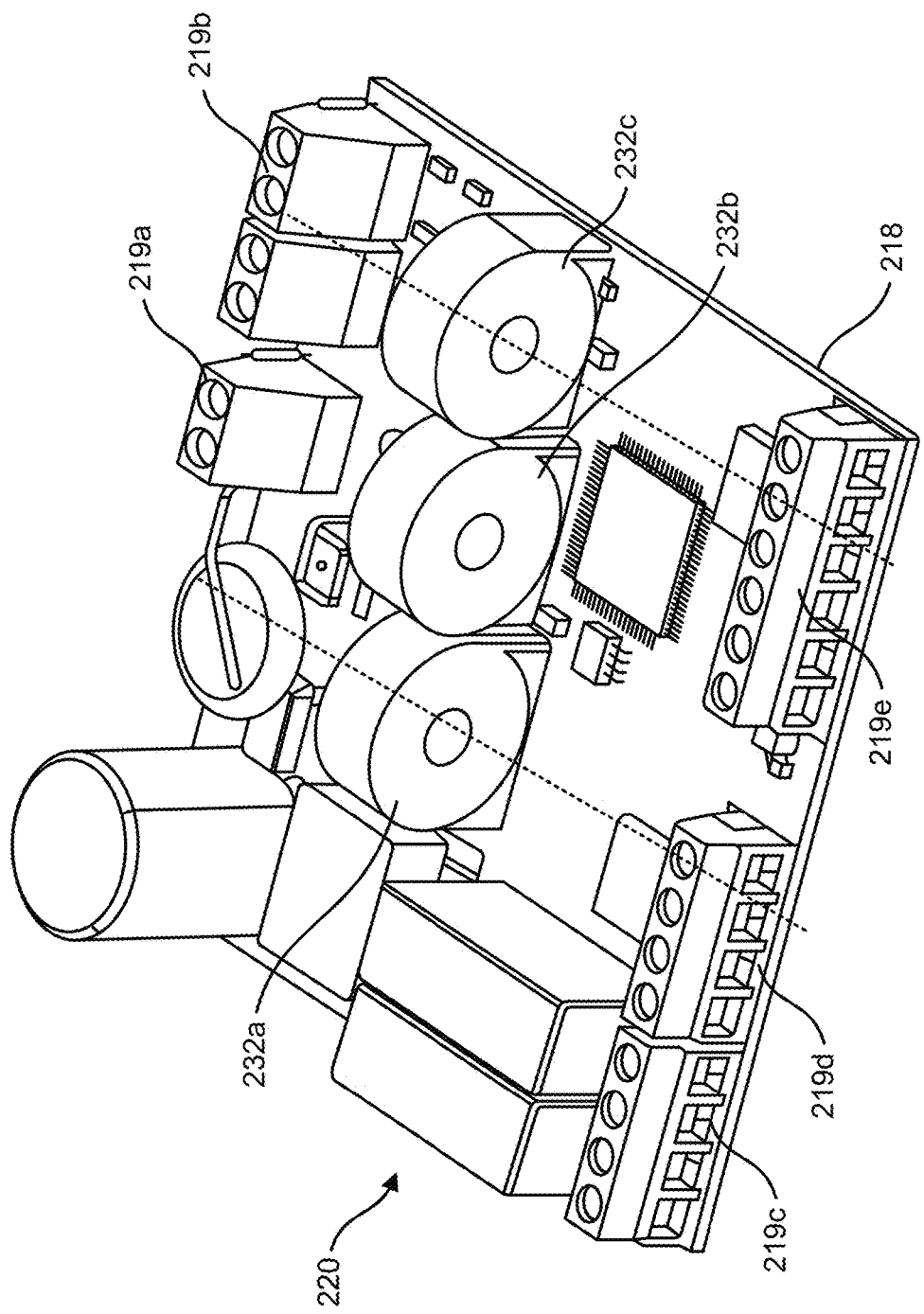
FIG. 8 illustrates a circuit board included within the power meter of FIG. 7.
Figure 20:
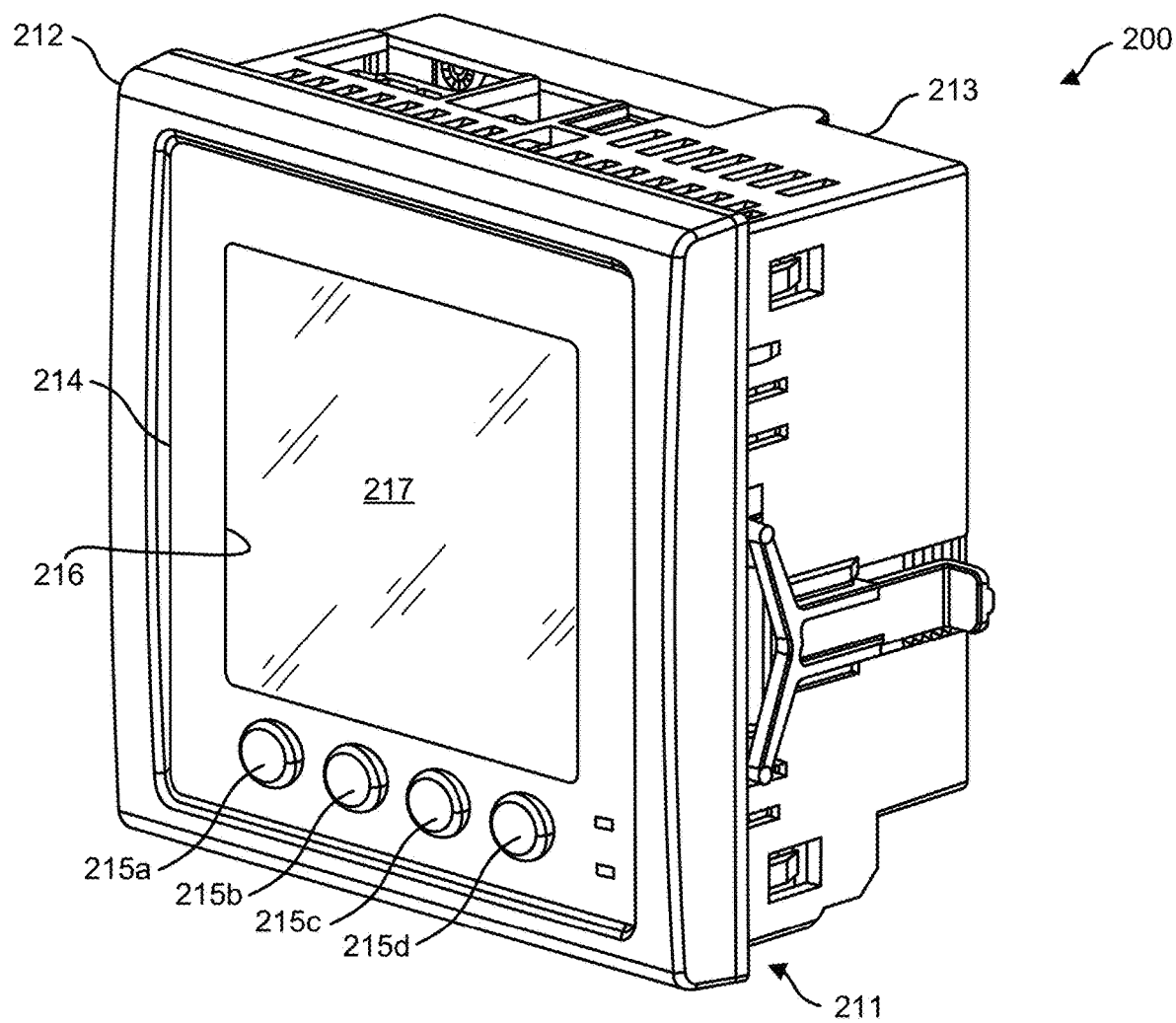
FIG. 20 illustrates another embodiment of a portion of an energy monitor.
Figure 21:
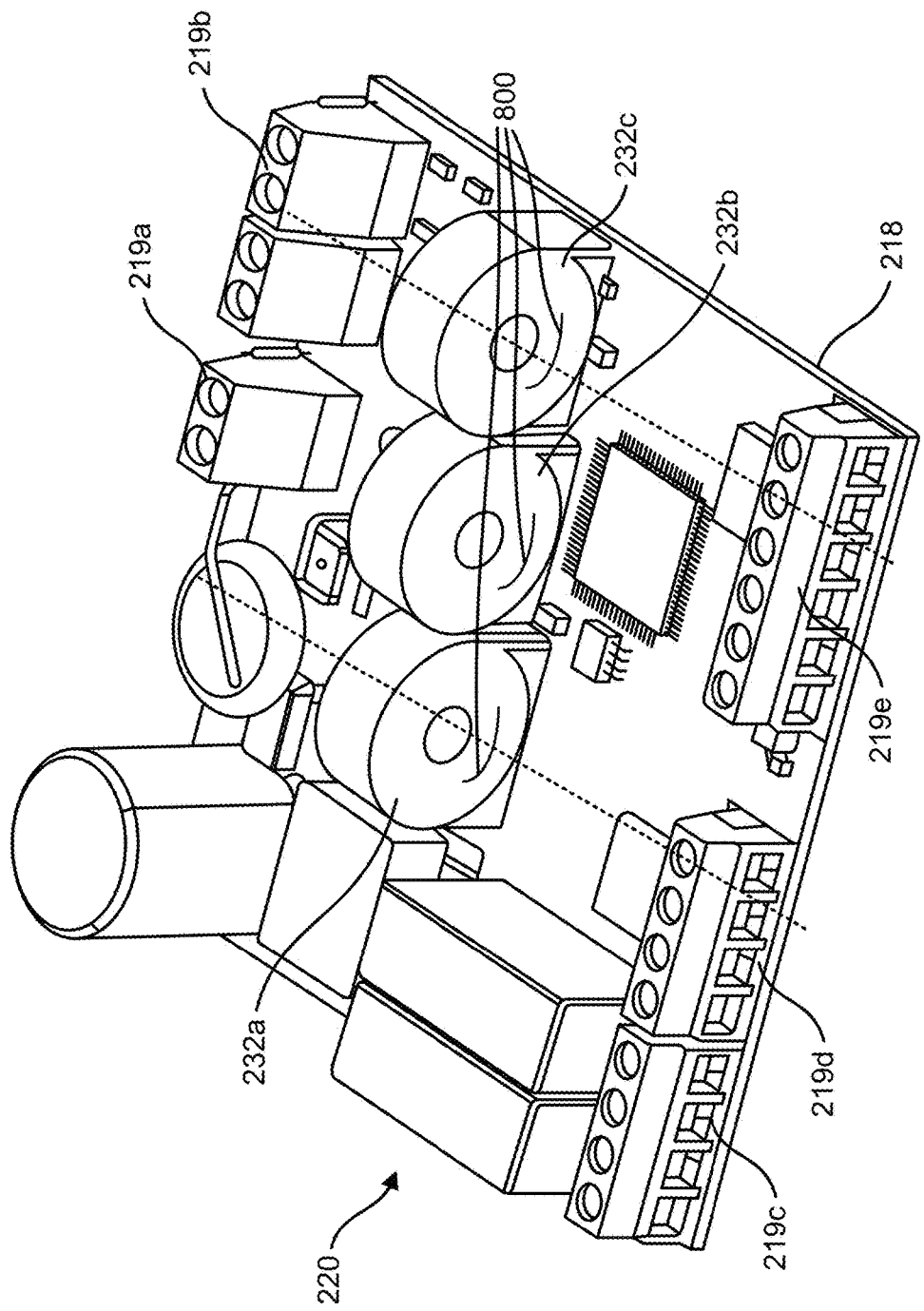
FIG. 21 illustrates another embodiment of a portion of the energy monitor of FIG. 20.

Referring to FIG. 20, another embodiment of a power meter 200 is housed in a housing 211 formed by a front bezel 212 and a back cover 213 that snap together, as illustrated in FIG. 7. The front bezel 212 may be bonded to a user-interface panel 214 that contains four manually operable pushbuttons 215a-215d and a central window 216 for viewing a display 217, such as an LCD, attached to the bezel 212. Behind the display 217 is a printed circuit board 218 (see FIG. 21) that has multiple terminal blocks 219a-219e and associated circuitry 220 mounted on one or both sides of the board 218, as illustrated in FIG. 8. The terminal blocks 219a and 219b are used to connect the circuitry 220 to a control power supply and voltage input lines, respectively. For example, the voltage lines may be from the power panel or from the wire to the load(s). In addition the same voltage lines, for example from the power panel or the wire to the load, may further be extended to pass through a respective current transformer to sense the current therein. Also, a respective current sensor of a set of one or more current transformers may encircle a respective wire to a load, where the wires from the respective current transformer being interconnected to suitable terminals of one or more of the terminal blocks. In this manner, the power meter is capable of sensing or otherwise receiving signals representative of the voltage and current in the wires to the load(s). Terminal block 219c may be used to connect digital outputs of the circuitry 220, such as demand sync signals, alarm signals or external control signals, to relays, motors, meters or other devices. Terminal block 129d may be an RS485 port used for communicating with a monitoring and control system and can be daisy chained to multiple devices. Terminal block 219e may be used to receive digital inputs for determining circuit breaker status, counting pulses, counting motor starts, accepting demand sync pulses, and/or input metering. The terminal blocks 219a-219e and the circuitry 220 (simplified for purposes of illustration) may be used to monitor either a single-phase, a two-phase, and/or a three-phase electrical power distribution system. Typically the meter is used to measure currents and voltages and report in real time their root-mean-square values, which includes values for all three phases and neutral in the case of a three-phase power distribution system. The meter also typically calculates power factor, real power, reactive power and other electrical parameters. In some embodiments, the housing 211 includes one or more connectors suitable to detachably connect a separate power meter to sense electrical properties of the current and/or voltage being sensed.

Figure 22:
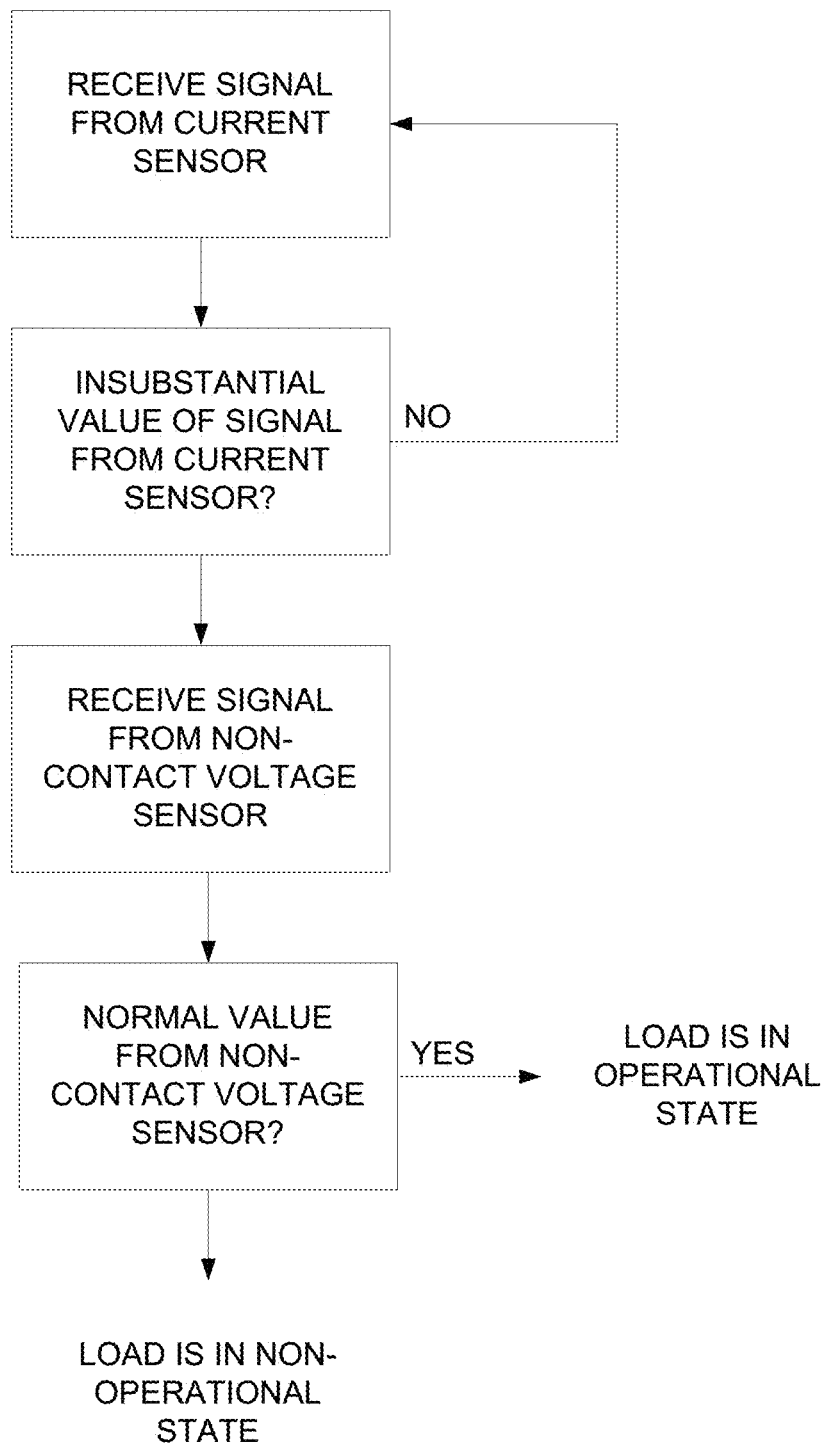
FIG. 22 illustrates another embodiment of the energy monitor with presence detection.

Referring to FIG. 22, it was determined that a particular load may have many operational and non-operational states associated with it. For example, in an operational state a particular load may be consuming an insubstantial amount of power, such as no power, when the load is not being used or otherwise in an idle state. When a particular load is consuming an insubstantial amount of power, the current sensed on one or more power conductors (such as one conductor for a single phase load, such as two conductors for a two phase load, and such as three conductors for a three phase load) will be zero or otherwise an insubstantial amount. In such case, the amount of current sensed will be substantially lower than a value that would be associated with normal operation of the load. However, while the particular load is consuming an insubstantial amount of power, the voltage level sensed to the load, such as by the non-contact voltage sensor, will remain at a level typically associated with normal operation of the load. For example, this may be generally 120 volts, generally 240, volts, or otherwise.

For example, in a non-operational state a particular load may be consuming an insubstantial amount of power, such as no power, when the load is not operational or in an alarm related condition. When a particular load is consuming an insubstantial amount of power, the current sensed on one or more power conductors (such as one conductor for a single phase load, such as two conductors for a two phase load, and such as three conductors for a three phase load) will be zero or otherwise an insubstantial amount. In such case, the amount of current sensed will be substantially lower than a value that would be associated with normal operation of the load such as zero. However, while the particular load is consuming an insubstantial amount of power, the voltage level sensed to the load, such as by the non-contact voltage sensor, will be zero or an insubstantial amount. In such case, the amount of voltage sensed will be substantially lower than a value that would be associated with normal operation of the load such as zero. When both the current sensed and the voltage sensed for a particular load, sensed on the one or more power conductors for a load, it indicates an alarm condition that would be the result of tripping one or more circuit breakers to the load.

When the operational state is determined for a particular load (e.g., insubstantial current level combined with a normal load level), and it is desirable to inspect the operation of the particular load, a technician may be dispatched to the load to determine what the likely cause of the operation state is. When the non-operational state is determined for a particular load (e.g., insubstantial current level combined with an insubstantial voltage level), and it is desirable to inspect the operation of the particular load, a technician may be dispatched to the circuit panel to reset the circuit breaker.

The power meter may provide an indication of the operational and non-operational state of one or more loads, such as whether the device is in an alarm condition and/or a particular type of alarm condition. The indication may be provided as a signal to a controller and/or as a register within the power meter that is accessible by the power meter or a remote controller, and/or a visual signal, and/or audio signal, and/or any other manner.

It is to be understood that the current sensor may be any suitable technique, including non-toroidal cores.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A phase aligned energy metering system comprising:
a plurality of current sensors suitable to sense current levels in a respective power conductor and the current sensors providing a respective first signal indicating respective the current levels;
a current module operatively connected to the plurality of current sensors suitable to receive first respective signals indicating the respective current levels and processing the first signal with a stored current sensor error correction data to output a first corrected signal;
a non-contact voltage sensor suitable to sense voltage levels in the respective power conductor and the non-contact voltage sensor providing a respective second signal indicating respective the voltage levels, wherein the non-contact voltage sensor is associated with a respective current sensor;
said non-contact voltage sensor providing a second respective signal indicating respective voltage levels as a second output;
a contact voltage sensor suitable to sense voltage levels in the respective the power conductor and providing a respective third signal indicating respective the voltage levels;
a voltage module operatively connected to the plurality of contact voltage sensors suitable to receive the third respective signal indicating the respective voltage levels and processing the third signal with a stored voltage sensor error correction data to output a third corrected signal; and
an energy meter that receives the first respective signal, the second respective signal, and the third respective signal, and determines a power level within the power conductor based upon the first corrected signal and the third corrected signal that are associated with the same the power conductor.

2. The phase aligned energy metering system of claim 1 wherein the second respective signal is based upon a magnitude of the sensed voltage levels.

3. The phase aligned energy metering system of claim 1 wherein the second respective signal is based upon a frequency of the sensed voltage levels.

4. The phase aligned energy metering system of claim 1 wherein the second respective signal is based upon a plurality of the sensed voltage levels.

5. The phase aligned energy metering system of claim 1 wherein the second respective signal is based upon a magnitude of the sensed voltage levels, a frequency of the sensed voltage levels, and a plurality of the sensed voltage levels.

6. A phase aligned energy metering system comprising:
a plurality of current sensors suitable to sense current levels in a respective power conductor and each of the plurality of current sensors providing a respective first signal indicating the respective current levels;
a current module operatively connected to the plurality of current sensors suitable to receive the first respective signal indicating the respective current levels and processing the first respective signal with a stored current sensor error correction data to output a first corrected signal;
a plurality of non-contact voltage sensors suitable to sense voltage levels in the respective power conductor and each of the plurality of non-contact voltage sensors providing a respective second signal indicating the respective voltage levels, wherein the plurality of non-contact voltage sensors associated with a respective current sensor;
said non-contact voltage sensor providing the second respective signal indicating the respective voltage levels as a second output;
a plurality of contact voltage sensors suitable to sense voltage levels in the respective power conductor and providing a respective third signal indicating the respective voltage levels;
a voltage module operatively connected to the plurality of contact voltage sensors suitable to receive the third respective signal indicating the respective voltage levels and processing the third respective signal with a stored voltage sensor error correction data to output a third corrected signal; and
an energy meter that receives the first corected signal, the second respective signal, and the third corrected signal that are associated with the same respective power conductor.

7. The phase aligned energy metering system of claim 6 wherein the second respective signal is based upon a magnitude of said the sensed voltage levels.

8. The phase aligned energy metering system of claim 6 wherein the second respective signal is based upon a frequency of the sensed voltage levels.

9. The phase aligned energy metering system of claim 6 wherein the second respective signal is based upon a plurality of the sensed voltage levels.

10. The phase aligned energy metering system of claim 6 wherein the second respective signal is based upon a magnitude of the sensed voltage levels, a frequency of the sensed voltage levels, and a plurality of the sensed voltage levels.

11. A phase aligned energy metering system comprising:
a current sensor suitable to sense current levels in a respective power conductor and the current sensor providing a respective first signal indicating the respective voltage levels;
a current module operatively connected to the plurality of current sensors suitable to receive the first respective signal indicating the respective current levels and processing the first respective signal with a stored current sensor error correction data to output a first corrected signal;
a non-contact voltage sensor suitable to sense voltage levels in the respective power conductor and the voltage sensor providing a respective second signal indicating the respective voltage levels, wherein the voltage sensor is associated with a respective current sensor;
a voltage module operatively connected to the plurality of voltage sensors suitable to receive the second respective signal indicating the respective voltage levels;
a contact voltage sensor suitable to sense voltage levels in the respective power conductor and providing a respective third signal indicating the respective voltage levels;
the voltage module operatively connected to the plurality of contact voltage sensors suitable to receive the third respective signal indicating the respective voltage levels and processing the third respective signal with a stored voltage sensor error correction data to output a third corrected signal; and
an energy meter that receives the first respective signal, the second respective signal, and the third respective signal, and determines a power level within the power conductor based upon the first corrected signal and the third corrected signal that are associated with the same the power conductor.

12. The phase aligned energy metering system of claim 11 wherein the second respective signal is based upon a magnitude of the sensed voltage levels.

13. The phase aligned energy metering system of claim 11 wherein the second respective signal is based upon a frequency of the sensed voltage levels.

14. The phase aligned energy metering system of claim 11 wherein the second respective signal is based upon a plurality of the sensed voltage levels.

15. The phase aligned energy metering system of claim 11 wherein the second respective signal is based upon a magnitude of the sensed voltage levels, a frequency of the sensed voltage levels, and a plurality of the sensed voltage levels.

16. A phase aligned energy metering system comprising:
a plurality of current sensors suitable to sense current levels in a respective power conductor and each of the plurality of current sensors providing a respective first signal indicating the respective current levels;
a current module operatively connected to the plurality of current sensors suitable to receive the first respective signal indicating the respective current levels and processing the first respective signal with a stored current sensor error correction data to output a first corrected signal;
a plurality of non-contact voltage sensors suitable to sense voltage levels in a respective power conductor and each of the plurality of the voltage sensors providing a respective second signal indicating the respective voltage levels, wherein the respective voltage sensors are associated with a respective current sensor;
the plurality of non-contact voltage sensors suitable to receive the second respective signal indicating the respective voltage levels;
a plurality of contact voltage sensors suitable to sense voltage levels in said the respective power conductor and providing a respective third signal indicating the respective voltage levels;
a voltage module operatively connected to the plurality of contact voltage sensors suitable to receive the third respective signal indicating the respective voltage levels and processing the third respective signal with a stored voltage sensor error correction data to output a third corrected signal; and an energy meter that receives the first corrected signal, the second respective signal, and the third corrected signal that are associated with the same respective power conductor.

17. The phase aligned energy metering system of claim 16 wherein the second respective signal is based upon a magnitude of said the sensed voltage levels.

18. The phase aligned energy metering system of claim 16 wherein the second respective signal is based upon a frequency of the sensed voltage levels.

19. The phase aligned energy metering system of claim 16 wherein the second respective signal is based upon a plurality of the sensed voltage levels.

20. The phase aligned energy metering system of claim 16 wherein the second respective signal is based upon a magnitude of the sensed voltage levels, a frequency of the sensed voltage levels, and a plurality of the sensed voltage levels.

* * * * *

UNITED STATES PATENT AND TRADEMARK OFFICE
CERTIFICATE OF CORRECTION

| | |
|---|---|
| PATENT NO. | : 11,215,650 B2 |
| APPLICATION NO. | : 15/789496 |
| DATED | : January 4, 2022 |
| INVENTOR(S) | : Martin Cook |

It is certified that error appears in the above-identified patent and that said Letters Patent is hereby corrected as shown below:

In the Specification

Column 5, Line 25: Change "In addition. the" to read --In addition, the--;

Column 5, Line 53: Change "1068" to read --106B--; and

In the Claims

Column 15, Line 43: Change "corected" to read --corrected--.

Signed and Sealed this
Ninth Day of January, 2024

*Katherine Kelly Vidal*

Katherine Kelly Vidal
*Director of the United States Patent and Trademark Office*